(12) United States Patent
Ko et al.

(10) Patent No.: US 12,112,783 B2
(45) Date of Patent: Oct. 8, 2024

(54) MAGNETIC MEMORY DEVICE WITH A PLURALITY OF CAPPING LAYERS

(71) Applicant: Samsung Electronics Co., Ltd., Suwon-si (KR)

(72) Inventors: Seung Pil Ko, Hwaseong-si (KR); Yongjae Kim, Seongnam-si (KR); Geonhee Bae, Suwon-si (KR); Gawon Lee, Suwon-si (KR); Kilho Lee, Hwaseong-si (KR)

(73) Assignee: Samsung Electronics Co., Ltd, Gyeonggi-Do (KR)

( * ) Notice: Subject to any disclaimer, the term of this patent is extended or adjusted under 35 U.S.C. 154(b) by 267 days.

(21) Appl. No.: 17/537,937

(22) Filed: Nov. 30, 2021

(65) Prior Publication Data
US 2022/0328083 A1    Oct. 13, 2022

(30) Foreign Application Priority Data
Apr. 12, 2021 (KR) ........................ 10-2021-0047290

(51) Int. Cl.
| G11C 11/16 | (2006.01) |
| H01L 23/528 | (2006.01) |
| H10B 61/00 | (2023.01) |
| H10N 50/10 | (2023.01) |
| H10N 50/20 | (2023.01) |
| H10N 50/80 | (2023.01) |
| H10N 50/85 | (2023.01) |

(52) U.S. Cl.
CPC .......... *G11C 11/161* (2013.01); *H01L 23/528* (2013.01); *H10B 61/00* (2023.02); *H10N 50/10* (2023.02); *H10N 50/20* (2023.02); *H10N 50/80* (2023.02); *H10N 50/85* (2023.02)

(58) Field of Classification Search
CPC ..... G11C 11/161; H01L 23/528; H10B 61/00; H10B 61/22; H10N 50/10; H10N 50/20; H10N 50/80; H10N 50/85
See application file for complete search history.

(56) References Cited

U.S. PATENT DOCUMENTS

| 9,041,146 B2 | 5/2015 | Lee et al. |
| 9,614,143 B2 | 4/2017 | Lu et al. |
| 9,704,919 B1 | 7/2017 | Lu et al. |
| 9,847,473 B2 | 12/2017 | Hsu et al. |
| 10,096,649 B2 | 10/2018 | Park et al. |
| 10,395,979 B2 | 8/2019 | Kim et al. |
| 10,504,902 B2 | 12/2019 | Kim et al. |

(Continued)

*Primary Examiner* — Jerome Leboeuf
(74) *Attorney, Agent, or Firm* — Harness, Dickey & Pierce, P.L.C.

(57) ABSTRACT

A magnetic memory device may include a substrate including a first region and a second region, a first interlayer insulating layer on the substrate, a first capping layer on the first interlayer insulating layer, the first capping layer covering the first and second regions of the substrate, a second interlayer insulating layer on a portion of the first capping layer covering the first region of the substrate, a bottom electrode contact included in the second interlayer insulating layer, a magnetic tunnel junction pattern on the bottom electrode contact, and a second capping layer on the second interlayer insulating layer, the second capping layer being in contact with the first capping layer on the second region of the substrate.

18 Claims, 16 Drawing Sheets

(56) References Cited

U.S. PATENT DOCUMENTS

| | | | |
|---|---|---|---|
| 10,535,814 B2 | 1/2020 | Chuang et al. | |
| 10,644,064 B2 | 5/2020 | Lee et al. | |
| 10,644,231 B2 | 5/2020 | Peng et al. | |
| 10,833,257 B1 | 11/2020 | Dutta et al. | |
| 11,551,736 B2 * | 1/2023 | Chuang | G11C 5/06 |
| 2017/0345869 A1 * | 11/2017 | Park | H10B 61/00 |
| 2018/0350874 A1 * | 12/2018 | Chuang | H10N 50/01 |
| 2019/0081102 A1 * | 3/2019 | Park | G11C 11/161 |
| 2019/0165258 A1 * | 5/2019 | Peng | H10N 50/10 |
| 2020/0106008 A1 | 4/2020 | Peng et al. | |
| 2020/0194496 A1 | 6/2020 | Hsieh et al. | |
| 2020/0381615 A1 | 12/2020 | Liu et al. | |

\* cited by examiner

MAGNETIC MEMORY DEVICE WITH A PLURALITY OF CAPPING LAYERS

CROSS-REFERENCE TO RELATED APPLICATIONS

This U.S. non-provisional patent application claims the benefit of priority under 35 U.S.C. § 119 to Korean Patent Application No. 10-2021-0047290, filed on Apr. 12, 2021, in the Korean Intellectual Property Office, the entire contents of which are hereby incorporated by reference.

BACKGROUND

Various example embodiments of the inventive concepts relate to a magnetic memory device including a magnetic tunnel junction, a system including the same, a method of operating the same, and/or a method of fabricating the same.

Due to an increasing demand for electronic devices with increased speed and/or reduced power consumption, semiconductor devices with faster operating speeds and/or lower operating voltages are desired and/or required. Magnetic memory devices have been suggested to satisfy such desires and/or requirements. For example, a magnetic memory device may provide technical advantages, such as high performance and/or non-volatility, and thus, the magnetic memory devices are emerging as next-generation memory devices.

A magnetic memory device includes a magnetic tunnel junction (MTJ) pattern. The MTJ pattern may include two magnetic layers and an insulating layer interposed therebetween. An electric resistance of the MTJ pattern depends on the magnetization directions of the magnetic layers. For example, the resistance of the MTJ pattern is higher when the magnetization directions of the magnetic layers are anti-parallel to each other than when they are parallel to each other. This difference in electric resistance may be used for data writing and/or reading operations of the magnetic memory device.

However, more research is still desired and/or needed to mass-produce the magnetic memory device, and satisfy demands for a magnetic memory device with higher integration density and/or lower power consumption properties.

SUMMARY

At least one example embodiment of the inventive concepts provides a highly-reliable magnetic memory device, a system including the magnetic memory device, a method of operating the magnetic memory device, and/or a method of fabricating the same.

At least one example embodiment of the inventive concepts provides a highly-integrated magnetic memory device, a system including the magnetic memory device, a method of operating the magnetic memory device, and/or a method of fabricating the same.

At least one example embodiment of the inventive concepts provides a method of fabricating a magnetic memory device in a stable and cost-effective manner, a method of operating the magnetic memory device, a magnetic memory device fabricated thereby, and/or a system including the magnetic memory device.

According to at least one example embodiment of the inventive concepts, a magnetic memory device may include a substrate including a first region and a second region, a first interlayer insulating layer on the substrate, a first capping layer on the first interlayer insulating layer, the first capping layer covering the first and second regions of the substrate, a second interlayer insulating layer on a portion of the first capping layer covering the first region of the substrate, a bottom electrode contact included in the second interlayer insulating layer, a magnetic tunnel junction pattern on the bottom electrode contact, and a second capping layer on the second interlayer insulating layer, the second capping layer being in contact with the first capping layer on the second region of the substrate.

According to at least one example embodiment of the inventive concepts, a magnetic memory device may include a substrate including a first region and a second region, a first interlayer insulating layer on the substrate, the first interlayer insulating layer covering the first and second regions of the substrate, a first capping layer on the first interlayer insulating layer, a second interlayer insulating layer on a portion of the first capping layer covering the first region of the substrate, a bottom electrode contact penetrating the second interlayer insulating layer, a magnetic tunnel junction pattern on the bottom electrode contact, a protection insulating layer covering a side surface of the magnetic tunnel junction pattern and the protection insulating layer covering the second interlayer insulating layer, a second capping layer on the first capping layer, and a gapfill insulating pattern on the first region of the substrate, the gapfill insulating pattern interposed between the protection insulating layer and the second capping layer. A side surface of the gapfill insulating pattern adjacent to the second region of the substrate may have a rounded shape.

According to at least one example embodiment of the inventive concepts, a magnetic memory device may include a substrate including a first region and a second region, a first interlayer insulating layer on the substrate, a capping layer on the first interlayer insulating layer, a second interlayer insulating layer on a portion of the first interlayer insulating layer covering the first region of the substrate, a plurality of bottom electrode contacts included in the second interlayer insulating layer, a plurality of data storage structures on the plurality of bottom electrode contacts, each data storage structure of the plurality of data storage structures including a bottom electrode, a magnetic tunnel junction pattern, and a top electrode, and the bottom electrode, the magnetic tunnel junction pattern, and the top electrode are sequentially stacked on a corresponding bottom electrode contact of the plurality of bottom electrode contacts, a protection insulating layer on the second interlayer insulating layer, the protection insulating layer covering side surfaces of each of the plurality of data storage structures, an upper capping layer on the protection insulating layer, the upper capping layer covering the first and second regions of the substrate, a third interlayer insulating layer on the capping layer, and an upper interconnection line on the top electrode. The capping layer may include a first portion covering the first interlayer insulating layer, and a second portion on a portion of the protection insulating layer on the first region of the substrate, the second portion including a recess region between the data storage structures, the recess region being recessed toward the substrate, and the third interlayer insulating layer fills the recess region of the second portion of the capping layer.

DETAILED DESCRIPTION

Figure 1:
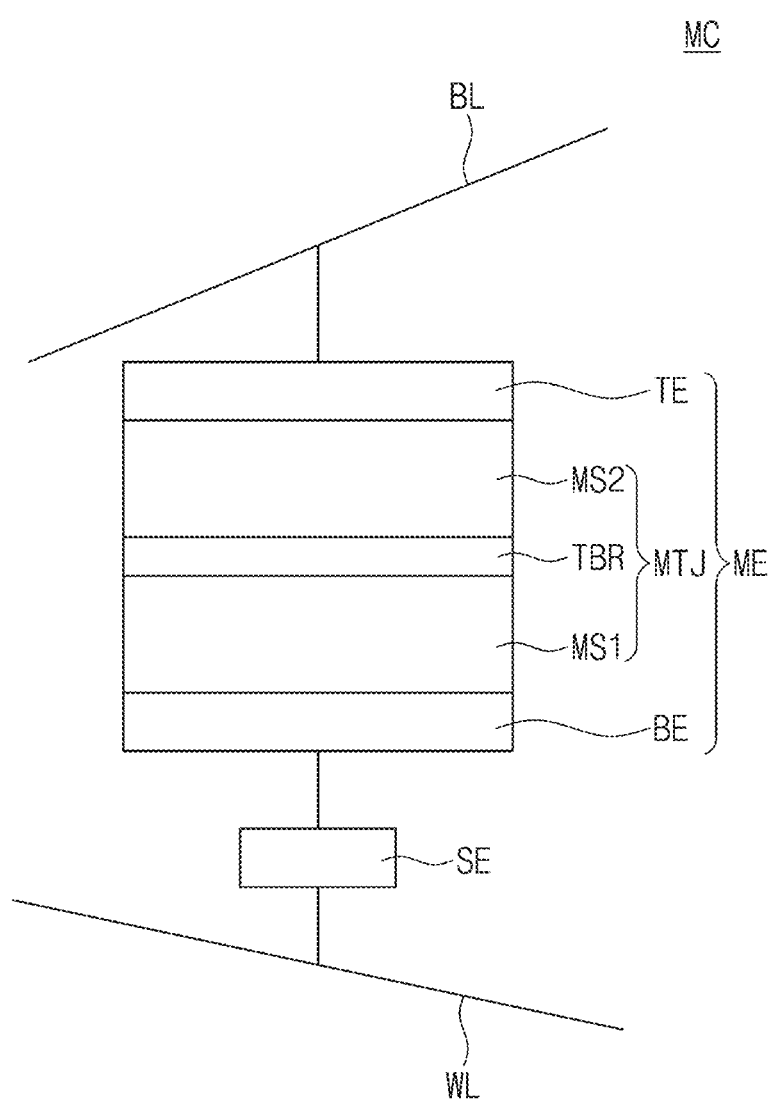
FIG. 1 is a circuit diagram illustrating a memory cell unit of a magnetic memory device according to at least one example embodiment of the inventive concepts.

Various example embodiments of the inventive concepts will now be described more fully with reference to the accompanying drawings, in which various example embodiments are shown. Descriptions of well-known components and processing techniques are omitted so as to not unnecessarily obscure the example embodiments herein. The example embodiments used herein are intended merely to facilitate an understanding of ways in which the example embodiments herein may be practiced and to further enable those of skill in the art to practice the example embodiments herein. Accordingly, the example embodiments described with reference to the drawings should not be construed as limiting the scope of the example embodiments of the inventive concepts.

It will be understood that when an element such as a layer, film, region, or substrate is referred to as being "on" another element, it may be directly on the other element or intervening elements may also be present. In contrast, when an element is referred to as being "directly on" another element, there are no intervening elements present. It will further be understood that when an element is referred to as being "on" another element, it may be above or beneath or adjacent (e.g., horizontally adjacent) to the other element.

It will be understood that elements and/or properties thereof (e.g., structures, surfaces, directions, or the like), which may be referred to as being "perpendicular," "parallel," "coplanar," or the like with regard to other elements and/or properties thereof (e.g., structures, surfaces, directions, or the like) may be "perpendicular," "parallel," "coplanar," or the like or may be "substantially perpendicular," "substantially parallel," "substantially coplanar," respectively, with regard to the other elements and/or properties thereof.

Elements and/or properties thereof (e.g., structures, surfaces, directions, or the like) that are "substantially perpendicular" with regard to other elements and/or properties thereof will be understood to be "perpendicular" with regard to the other elements and/or properties thereof within manufacturing tolerances and/or material tolerances and/or have a deviation in magnitude and/or angle from "perpendicular," or the like with regard to the other elements and/or properties thereof that is equal to or less than 10% (e.g., a. tolerance of ±10%).

Elements and/or properties thereof (e.g., structures, surfaces, directions, or the like) that are "substantially parallel" with regard to other elements and/or properties thereof will be understood to be "parallel" with regard to the other elements and/or properties thereof within manufacturing tolerances and/or material tolerances and/or have a deviation in magnitude and/or angle from "parallel," or the like with regard to the other elements and/or properties thereof that is equal to or less than 10% (e.g., a. tolerance of ±10%).

Elements and/or properties thereof (e.g., structures, surfaces, directions, or the like) that are "substantially coplanar" with regard to other elements and/or properties thereof will be understood to be "coplanar" with regard to the other elements and/or properties thereof within manufacturing tolerances and/or material tolerances and/or have a deviation in magnitude and/or angle from "coplanar," or the like with regard to the other elements and/or properties thereof that is equal to or less than 10% (e.g., a. tolerance of ±10%)).

It will be understood that elements and/or properties thereof may be recited herein as being "the same" or "equal" as other elements, and it will be further understood that elements and/or properties thereof recited herein as being "identical" to, "the same" as, or "equal" to other elements may be "identical" to, "the same" as, or "equal" to, "about identical" to, "about the same" as, "about equal" to, "substantially identical" to, "substantially the same" as or "substantially equal" to the other elements and/or properties thereof. Elements and/or properties thereof that are about identical to, "about the same" as, "about equal" to, "substantially identical" to, "substantially the same" as or "substantially equal" to other elements and/or properties thereof will be understood to include elements and/or properties thereof that are identical to, the same as, or equal to the other elements and/or properties thereof within manufacturing tolerances and/or material tolerances. Elements and/or properties thereof that are identical or substantially identical to and/or the same or substantially the same as other elements and/or properties thereof may be structurally the same or substantially the same, functionally the same or substantially the same, and/or compositionally the same or substantially the same.

It will be understood that elements and/or properties thereof described herein as being "substantially" the same, equal, and/or identical encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof.

It will be understood that elements and/or properties thereof described herein as being "about" the same, equal, and/or identical encompasses elements and/or properties thereof that have a relative difference in magnitude that is equal to or less than 10%. Further, regardless of whether elements and/or properties thereof are modified as "substantially" or "about," it will be understood that these elements and/or properties thereof should be construed as including a manufacturing or operational tolerance (e.g., ±10%) around the stated elements and/or properties thereof.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

FIG. 1 is a circuit diagram illustrating a memory cell unit of a magnetic memory device according to at least one example embodiment of the inventive concepts.

Referring to FIG. 1, a memory cell unit MC may include a memory element ME and/or a selection element SE, etc., but is not limited thereto and may include a greater or lesser number of constituent elements. The memory element ME may be provided between and connected to a bit line BL and the selection element SE, and the selection element SE may be provided between and connected to the memory element ME and a word line WL, but the example embodiments are not limited thereto. The memory element ME may be a variable resistance device whose resistance can be switched to one of at least two states by an electric pulse (e.g., current) applied thereto, but is not limited thereto. In at least one example embodiment, the memory element ME may have a layered structure whose electric resistance can by changed by a spin transfer process that is caused when an electric current passes through the memory element ME, etc. For example, the memory element ME may have a layered structure, which is configured to exhibit a magneto-resistance property, and may include at least one ferromagnetic material and/or at least one antiferromagnetic material, but the example embodiments are not limited thereto. The selection element SE may be configured to selectively control an electric current flowing through the memory element ME. As an example, the selection element SE may be one of a diode, a PNP bipolar transistor, an NPN bipolar transistor, an NMOS field effect transistor, and/or a PMOS field effect transistor, etc., but is not limited thereto. In the case where the selection element SE is a three-terminal device (e.g., a bipolar transistor, a MOS field effect transistor, etc.), an additional interconnection line (not shown) may be connected to the selection element SE, but the example embodiments are not limited thereto.

According to at least on example embodiment, the memory element ME may include a magnetic tunnel junction pattern MTJ, but is not limited thereto. The magnetic tunnel junction pattern MTJ may include a first magnetic structure MS1, a second magnetic structure MS2, and/or a tunnel barrier pattern TBR therebetween, etc., but is not limited thereto. Each of the first and second magnetic structures MS1 and MS2 may include at least one magnetic layer which is formed of and/or includes at least one magnetic material. The memory element ME may further include a bottom electrode BE, which is interposed between and/or connected to the magnetic tunnel junction pattern MTJ and the selection element SE, and a top electrode TE, which is interposed between and/or connected to the magnetic tunnel junction pattern MTJ and the bit line BL, but the example embodiments are not limited thereto.

Figure 2:
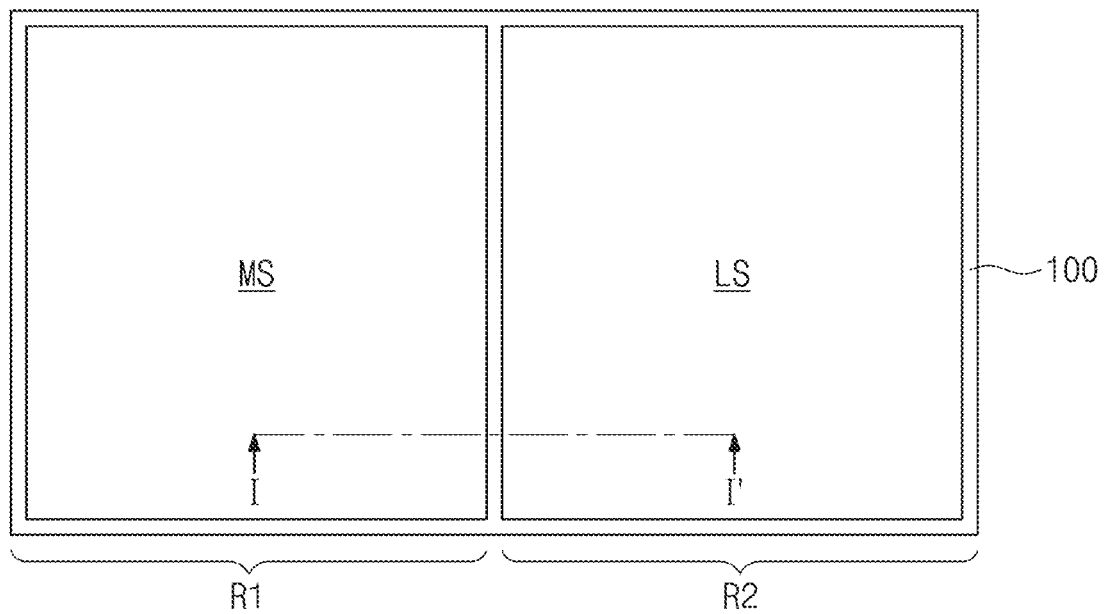
FIG. 2 is a plan view illustrating a magnetic memory device according to at least one example embodiment of the inventive concepts.
Figure 3:
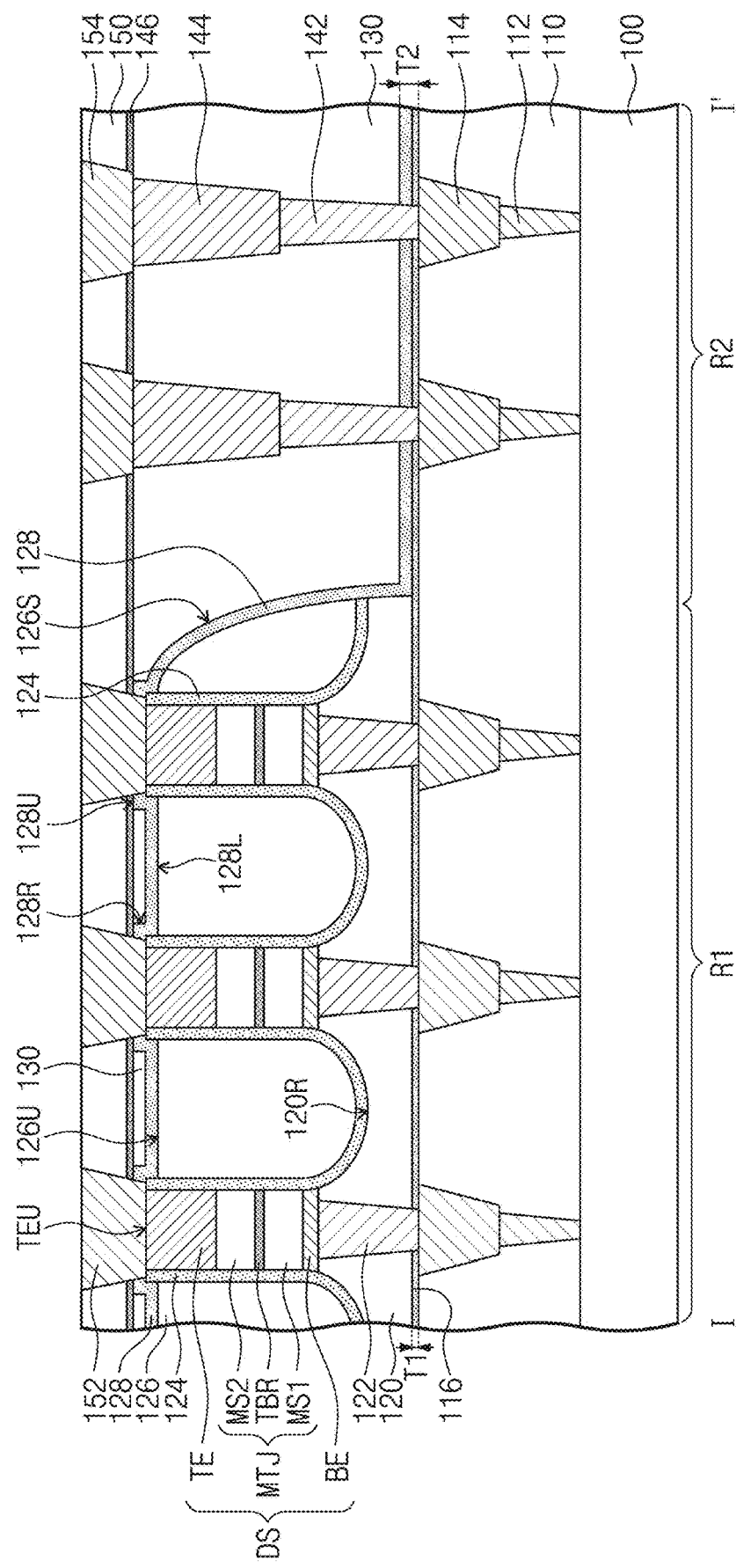
FIG. 3 is a sectional view, which is taken along a line I-I' of FIG. 2 to illustrate a magnetic memory device according to at least one example embodiment of the inventive concepts.

FIG. 2 is a plan view illustrating a magnetic memory device according to at least one example embodiment of the inventive concepts. FIG. 3 is a sectional view, which is taken along a line I-I' of FIG. 2 to illustrate a magnetic memory device according to at least one example embodiment of the inventive concepts.

Referring to FIGS. 2 and 3, a substrate 100 may be provided. According to some example embodiments, the substrate 100 may include at least a first region R1 provided and/or included with a memory structure MS, and a second region R2 provided and/or included with a logic structure LS, etc., but the example embodiments are not limited thereto. The memory structure MS may one or more memory cells, such as the memory cell MC described with reference to FIG. 1, etc., but is not limited thereto. The logic structure LS may include logic circuits which may be used to perform a specific logical operation, and/or the logic structure LS may include memory peripheral circuits (e.g., memory circuitry, peripheral circuitry, etc.), which may be used to operate and/or control (e.g., read, write, etc.) one or more memory cells. For example, the substrate 100 may be a semiconductor substrate, such as silicon, silicon-on-insulator (SOI), silicon germanium (SiGe), germanium (Ge), and/or gallium arsenide (GaAs) wafers, etc., but the example embodiments are not limited thereto.

According to at least one example embodiment, at least one lower contact 112 and/or at least one lower interconnection line 114 may be disposed on the substrate 100, but the example embodiments are not limited thereto. In at least one example embodiment, the lower contact 112 and/or the lower interconnection line 114 may be provided in plural, or in other words, there may be a plurality of lower contacts 112 and/or a plurality of lower interconnection lines 114, but the example embodiments are not limited thereto. The lower contacts 112 and the lower interconnection lines 114 may be disposed on the first and/or the second regions R1 and R2 of the substrate 100, but are not limited thereto. The lower contacts 112 may be disposed between the substrate 100 and the lower interconnection lines 114, but is not limited thereto. The lower interconnection lines 114 may be disposed to be horizontally spaced apart from each other, but are not limited thereto. The lower contacts 112 and/or the lower interconnection lines 114 may be disposed in a first interlayer insulating layer 110, which will be described below, and may penetrate a first interlayer insulating layer 110, etc. Each of the lower interconnection lines 114 may be electrically connected to the substrate 100 through a corresponding lower contact of the plurality of lower contacts 112. The lower contacts 112 and the lower interconnection lines 114 may be formed of or include at least one of conductive metallic materials, e.g., copper (Cu), etc., but the example embodiments are not limited thereto. According to at least one example embodiment, the expression "two elements are electrically connected/coupled to each other" may mean that the elements are directly connected/coupled to each other and/or are indirectly connected/coupled to each other through, for example, another conductive element, etc., but the example embodiments are not limited thereto.

According to at least one example embodiment, one or more selection elements (not shown) may be disposed in the substrate 100. As an example, the selection elements may be field effect transistors, etc., but the example embodiments are not limited thereto. Each of the plurality of lower interconnection lines 114 may be electrically connected to at least one terminal of a corresponding selection element of the plurality of selection elements through a corresponding lower contact of the plurality of lower contacts 112, but the example embodiments are not limited thereto.

The first interlayer insulating layer 110 may be disposed on the substrate 100 to cover, for example, the first and/or the second regions R1 and R2 of the substrate 100, but is not limited thereto. The first interlayer insulating layer 110 may cover the lower contacts 112 and/or the lower interconnection lines 114, etc. The lower interconnection lines 114 may have top surfaces that are coplanar and/or substantially coplanar with a top surface of the first interlayer insulating layer 110 (e.g., may be coplanar within +/−10% of the top surface of the first interlayer insulating layer 110). In other words, the top surfaces of the lower interconnection lines 114 may be located at the same level (e.g., height, etc.) and/or substantially same level as the top surface of the first interlayer insulating layer 110 (e.g., within +/−10% of the height of the top surface of the first interlayer insulating layer 110). According to at least one example embodiment, the term 'level' may mean a vertical height measured from a top surface of the substrate 100. The first interlayer insulating layer 110 may be formed of and/or may include at least one of, for example, oxide, nitride, and/or oxynitride, etc., but is not limited thereto.

A first capping layer 116 may be disposed on the lower interconnection lines 114 and/or the first interlayer insulating layer 110, but is not limited thereto. The first capping layer 116 may conformally cover the first and/or the second regions R1 and R2 of the substrate 100, etc. The first capping layer 116 may cover the top surfaces of the lower interconnection lines 114 and/or the top surface of the first interlayer insulating layer 110, etc. The first capping layer 116 may be formed of and/or include a material that is different from the first interlayer insulating layer 110, but the example embodiments are not limited thereto. The first capping layer 116 may be formed of and/or include at least one material having an etch selectivity the same as and/or similar to the first interlayer insulating layer 110, but the example embodiments are not limited thereto. The first capping layer 116 may be formed of and/or include at least one nitride materials, e.g., silicon nitride, silicon carbonitride, etc.

A second interlayer insulating layer 120 may be disposed on the first capping layer 116, but is not limited thereto. The second interlayer insulating layer 120 may be disposed on the first region R1 of the substrate 100 to cover the first capping layer 116, and the second interlayer insulating layer 120 may be disposed (and/or etched) such that the second region R2 of the substrate 100 is exposed, but the example embodiments are not limited thereto. The second interlayer insulating layer 120 may include at least a plurality of first recess regions 120R, which are formed on both sides of at least one data storage structure DS (e.g., between the data storage structures DS) to be described below, and the first recess regions 120R may be recessed toward the substrate 100, but are not limited thereto. As an example, the lowermost surface of the first recess region 120R may be located at a level that is lower than a top surface of a bottom electrode contact 122 to be described below, or in other words, the lowest surface of the first recess region 120R may be lower than the top surface of the bottom electrode contact 122, but is not limited thereto. The second interlayer insulating layer 120 may be formed of and/or include at least one of, for example, oxide and/or silicon oxide, etc.

At least one bottom electrode contact 122 may be disposed on the substrate 100, but is not limited thereto. Additionally, the at least one bottom electrode contact 122 may be disposed on and/or included in the first region R1 of the substrate 100, but is not limited thereto. In at least one example embodiment, a plurality of the bottom electrode contacts 122 may be provided to be horizontally spaced apart from each other, etc. The bottom electrode contacts 122 may be disposed in the first capping layer 116 and/or the second interlayer insulating layer 120, but the example embodiments are not limited thereto. Each of the bottom electrode contacts 122 may be provided to penetrate the first capping layer 116 and/or the second interlayer insulating layer 120, and each of the bottom electrode contacts 122 may be electrically connected to a corresponding lower interconnection line of the plurality of lower interconnection lines 114, but are not limited thereto. The bottom electrode contact 122 may be formed of and/or include at least one of doped semiconductor materials (e.g., doped silicon, etc.), metallic materials (e.g., tungsten, titanium, tantalum, cobalt, molybdenum, and/or ruthenium, etc.), metal-semiconductor compounds (e.g., metal silicide, etc.), and/or conductive metal nitride materials (e.g., titanium nitride, tantalum nitride, and/or tungsten nitride, etc.), but the example embodiments are not limited thereto.

The at least one data storage structure DS may be disposed on the first region R1 of the substrate 100. In at least one example embodiment, a plurality of the data storage structures DS may be provided to be horizontally spaced apart from each other, but are not limited thereto. The data storage structures DS may be disposed on and electrically connected to the bottom electrode contacts 122, respectively, but the example embodiments are not limited thereto.

The at least one data storage structure DS may include the bottom electrode BE, the magnetic tunnel junction pattern MTJ, and/or the top electrode TE, etc., which may be sequentially stacked on the bottom electrode contacts 122, but the example embodiments are not limited thereto. The bottom electrode BE may be disposed between the bottom electrode contacts 122 and the magnetic tunnel junction pattern MTJ, and the magnetic tunnel junction pattern MTJ may be disposed between the bottom electrode BE and the top electrode TE, but the example embodiments are not limited thereto. The magnetic tunnel junction pattern MTJ may include at least a first magnetic structure MS1, a second magnetic structure MS2, and/or a tunnel barrier pattern TBR arranged therebetween, but the example embodiments are not limited thereto. The first magnetic structure MS1 may be disposed between the bottom electrode BE and the tunnel barrier pattern TBR, and the second magnetic structure MS2 may be disposed between the top electrode TE and the tunnel barrier pattern TBR, but the example embodiments are not limited thereto. The bottom electrode BE may be formed of and/or include at least one conductive metal nitrides, e.g., titanium nitride and/or tantalum nitride, etc., but the example embodiments are not limited thereto. The top electrode TE may be formed of and/or include at least one of metallic materials (e.g., Ta, W, Ru, and/or Jr, etc.) and/or conductive metal nitrides (e.g., TiN, etc.).

A bottom surface of the bottom electrode contact 122 may be in contact with a corresponding lower interconnection line of the plurality of lower interconnection lines 114, and a top surface of the bottom electrode contact 122 may be in contact with a bottom surface of the bottom electrode BE of the data storage structure DS, but the example embodiments are not limited thereto.

Figure 4A:
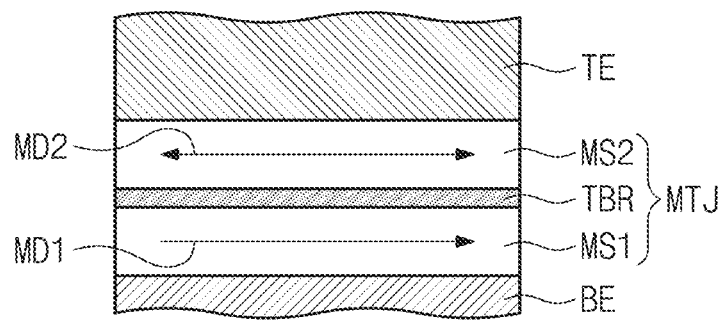
FIGS. 4A and 4B are sectional views, each of which illustrates a magnetic tunnel junction pattern of a magnetic memory device according to at least one example embodiment of the inventive concepts.
Figure 4B:
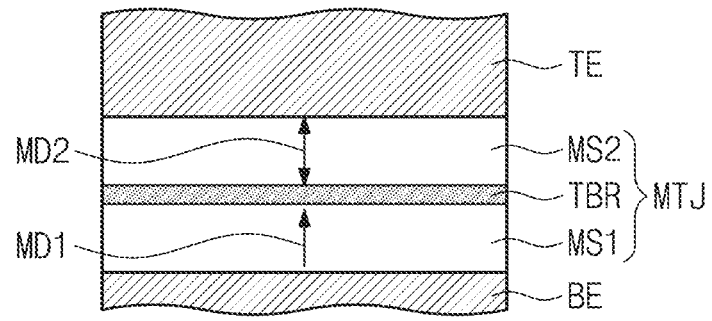

FIGS. 4A and 4B are sectional views, each of which illustrates a magnetic tunnel junction pattern of a magnetic memory device according to at least one example embodiment of the inventive concepts.

Referring to FIGS. 4A and 4B, according to at least one example embodiment, a first magnetic structure MS1 may include a reference layer having a magnetization direction MD1, which is fixed to a specific direction, and a second magnetic structure MS2 may include a free layer having a magnetization direction MD2, which may be changed to be parallel or anti-parallel (e.g., opposite direction, etc.) to the magnetization direction MD1 of the first magnetic structure MS1, etc. FIGS. 4A and 4B illustrates examples, in which the second magnetic structure MS2 includes the free layer, but the example embodiments of the inventive concepts are not limited to these examples. For example, the first and second magnetic structures MS1 and MS2 may both be configured to include the free and reference layers, respectively, unlike that shown in FIGS. 4A and 4B, etc., there may be a greater or lesser number of magnetic structures, etc. In at least one example embodiment, as shown in FIG. 4A, the magnetization directions MD1 and MD2 of the first and second magnetic structures MS1 and MS2 may be parallel to an interface between the tunnel barrier pattern TBR and the second magnetic structure MS2, but the example embodiments are not limited thereto. In this case, each of the first and second magnetic structures MS1 and MS2 may include a ferromagnetic material, but are not limited thereto. The first magnetic structure MS1 may further include an antiferromagnetic material, which is used to fix a magnetization direction of the ferromagnetic material in the first magnetic structure MS1, but is not limited thereto. In at least one other example embodiment, as shown in FIG. 4B, the magnetization directions MD1 and MD2 of the first and second magnetic structures MS1 and MS2 may be perpendicular to the interface between the tunnel barrier pattern TBR and the second magnetic structure MS2, but are not limited thereto. In this case, each of the first and second magnetic structures MS1 and MS2 may include at least one of perpendicular magnetic materials (e.g., CoFeTb, CoFeGd, and/or CoFeDy, etc.), perpendicular magnetic materials with L10 structure, CoPt-based materials with hexagonal-close-packed structure, and/or perpendicular magnetic structures, etc. The perpendicular magnetic material with the L10 structure may include at least one of L10 FePt, L10 FePd, L10 CoPd, and/or L10 CoPt, etc., but the example embodiments are not limited thereto. The perpendicular magnetic structures may include magnetic and non-magnetic layers that are alternatingly and repeatedly stacked, but the example embodiments are not limited thereto. As an example, the perpendicular magnetic structure may include at least one of (Co/Pt)n, (CoFe/Pt)n, (CoFe/Pd)n, (Co/Pd)n, (Co/Ni)n, (CoNi/Pt)n, (CoCr/Pt)n, and/or (CoCr/Pd)n, etc., where "n" is a natural number equal to or greater than 2.

In at least one example embodiment, each of the first and second magnetic structures MS1 and MS2 may be formed of and/or include at least one of Heusler alloys, but the example embodiments are not limited thereto. The Heusler alloys may include Co-based full-Heusler alloys, etc. The Co-based full-Heusler alloys may include $Co_2FeSi$, $Co_2MnSi$, $Co_2FeMnSi$, $Co_2FeAl$, and/or $Co_2CrAl$, etc.

The tunnel barrier pattern TBR may be formed of and/or include at least one of magnesium oxide, titanium oxide, aluminum oxide, magnesium-zinc oxide, and/or magnesium-boron oxide, etc., but is not limited thereto.

Referring back to FIGS. 2 and 3, according to at least one example embodiment, a protection insulating layer 124 may be provided on the first region R1 of the substrate 100, etc. The protection insulating layer 124 may cover a side surface of the data storage structure DS, but is not limited thereto. The protection insulating layer 124 may be provided to enclose at least one side surface of the data storage structure DS, when viewed in a plan view. Additionally, the protection insulating layer 124 may cover the side surfaces of the bottom electrode BE, the magnetic tunnel junction pattern MTJ, and/or the top electrode TE, etc., and/or may enclose the side surfaces of the bottom electrode BE, the magnetic tunnel junction pattern MTJ, and/or the top electrode TE, etc., when viewed in a plan view, but is not limited thereto. The protection insulating layer 124 may be extended into the first recess region 120R of the second interlayer insulating layer 120 to conformally cover an inner side surface and a bottom surface of the first recess region 120R, but the example embodiments are not limited thereto. The protection insulating layer 124 may be disposed (and/or etched) such that a top surface TEU of the top electrode TE is exposed. The protection insulating layer 124 may be used to reduce and/or prevent the side surfaces of the magnetic tunnel junction pattern MTJ from becoming oxidized in a subsequent process. The protection insulating layer 124 may be formed of and/or include at least one insulating materials, e.g., silicon nitride, silicon oxynitride, silicon carbonitride, silicon carbon oxynitride, aluminum oxide, and/or aluminum nitride, etc.

A gapfill insulating pattern 126 may be disposed on the protection insulating layer 124 and may cover the first region R1 of the substrate 100, etc. Additionally, the gapfill insulating pattern 126 may cover the data storage structure DS. For example, the gapfill insulating pattern 126 may fill a remaining portion of the first recess region 120R, but the example embodiments are not limited thereto. The gapfill insulating pattern 126 may be interposed between the protection insulating layer 124 and a second capping layer 128, which will be described below, but the example embodiments are not limited thereto. The gapfill insulating pattern 126 may be etched and/or otherwise disposed such that the second region R2 of the substrate 100 is exposed, but is not limited thereto. The gapfill insulating pattern 126 may be etched and/or otherwise provided such that the top surface TEU of the top electrode TE is exposed and/or at least a portion of an outer side surface of the uppermost portion of the protection insulating layer 124, e.g., at least a portion of the protection insulating layer 124 adjacent to the top surface TEU of the top electrode TE is exposed, but is not limited thereto. A top surface 126U of the gapfill insulating pattern 126 may be located at a level that is lower than the top surface TEU of the top electrode TE, or in other words, the top surface 126U of the gapfill insulating pattern 126 may be lower than the top surface of the TEU of the top electrode TE, but is not limited thereto. A side surface 126S of the gapfill insulating pattern 126, which is adjacent to the second region R2 of the substrate 100, may be inclined at an angle, but is not limited thereto. The side surface 126S of the gapfill insulating pattern 126 may face the second region R2 of the substrate 100, and an angle of the side surface 126S to the top surface of the substrate 100 may gradually increase as the distance from the substrate 100 decreases, but the example embodiments are not limited thereto. In other words, the angle of the side surface 126S may be greater the closer the side surface 126 is to the substrate 100. For example, the side surface 126S of the gapfill insulating pattern 126 may have a rounded shape and/or may have a downward slope in a direction toward the second region R2 of the substrate 100, but is not limited thereto. As an example, the gapfill insulating pattern 126 may protrude in a direction toward the second region R2 of the substrate 100, but is not limited thereto. For example, an absolute value of a slope of an upper portion of the side surface 126S of the gapfill insulating pattern 126 may be smaller than an absolute value of a slope of a lower portion of the side surface 126S of the gapfill insulating pattern 126, but the example embodiments are not limited thereto. The gapfill insulating pattern 126 may be formed of and/or include at least one of, for example, oxide and/or silicon oxide, etc. In at least one example embodiment, the gapfill insulating pattern 126 may be formed of and/or include the same material as the second interlayer insulating layer 120, but the example embodiments are not limited thereto.

The protection insulating layer 124 may be interposed between the side surface of the data storage structure DS and the gapfill insulating pattern 126, and may be extended into a region between the inner surface of the first recess region 120R of the second interlayer insulating layer 120 and the gapfill insulating pattern 126, but the example embodiments are not limited thereto. The protection insulating layer 124 may be formed of and/or include a material that is different from the second interlayer insulating layer 120 and the gapfill insulating pattern 126, but is not limited thereto. The protection insulating layer 124 may be formed of and/or include a material that has an etch selectivity the same as and/or similar to the second interlayer insulating layer 120 and/or the gapfill insulating pattern 126, etc., but the example embodiments are not limited thereto. The protection insulating layer 124 may be formed of and/or include at least one nitride material, e.g., silicon nitride, etc., but is not limited thereto.

The second capping layer 128 may be disposed on the substrate 100 and may cover the first and second regions R1 and R2 of the substrate 100, but is not limited thereto. For example, the second capping layer 128 may conformally cover a top surface of the gapfill insulating pattern 126 on the first region R1 of the substrate 100, and/or may cover at least a portion of the outer side surface of the uppermost portion of the protection insulating layer 124, but is not limited thereto. The second capping layer 128 may conformally cover the side surface 126S of the gapfill insulating pattern 126 on the first region R1 of the substrate 100 and may be extended to conformally cover the top surface of the first capping layer 116 which is on the second region R2 of the substrate 100, but is not limited thereto. The second capping layer 128 may be in contact with the top surface of the first capping layer 116 on the second region R2 of the substrate 100, but is not limited thereto. The second capping layer 128 may be formed (and/or etched) such that the top surface TEU of the top electrode TE is exposed, but the example embodiments are not limited thereto. The second capping layer 128 may have at least one second recess region 128R, which is located between the data storage structures DS and is recessed toward the substrate 100, but the example embodiments are not limited thereto. In other words, the uppermost surface 128U of the second capping layer 128 may be located at a level higher than a bottom surface of the second recess region 128R (e.g., the uppermost surface 128U of the second capping layer 128 is higher than a bottom surface of the second recess region 128R, etc.), and/or the lowermost surface 128L of the second capping layer 128 may be located at a level lower than the bottom surface of the second recess region 128R (e.g., the lowermost surface 128L of the second capping layer 128 may be lower than the bottom surface of the second recess region 128R, etc.), but the example embodiments are not limited thereto. The uppermost surface 128U of the second capping layer 128 may be located at a level that is higher than the top surface TEU of the top electrode TE (e.g., the uppermost surface 128U of the second capping layer 128 may be higher than the top surface TEU of the top electrode TE, etc.), and/or the lowermost surface 128L of the second capping layer 128 may be located at a level that is lower than the top surface TEU of the top electrode TE (e.g., the lowermost surface 128L of the second capping layer 128 may be lower than the top surface TEU of the top electrode TE, etc.), but the example embodiments are not limited thereto.

The second capping layer 128 may be formed of and/or include a material which is different from the first interlayer insulating layer 110, the second interlayer insulating layer 120, and/or the gapfill insulating pattern 126, etc., but the example embodiments are not limited thereto. The second capping layer 128 may be formed of and/or include a material having an etch selectivity the same as and/or similar to the gapfill insulating pattern 126, but the example embodiments are not limited thereto. For example, the second capping layer 128 may be formed of and/or include at least one nitride materials, e.g., silicon nitride, silicon carbonitride, etc., but the example embodiments are not limited thereto. In at least one example embodiment, the first and second capping layers 116 and 128 may be formed of and/or include the same material, and/or may be formed of and/or include materials having substantially the same dielectric constant (k) (e.g., have a dielectric constant value within +/−10% of the other material's dielectric constant), but the example embodiments are not limited thereto. According to some example embodiments, unlike the illustrated structure of FIGS. 2 and 3, the first and second capping layers 116 and 128 on the second region R2 of the substrate 100 may be formed as a single object, without any observable interface therebetween, but the example embodiments are not limited thereto. For example, a thickness T1 of the first capping layer 116 on the first region R1 of the substrate 100 may be a desired ratio of the total thickness T2 of the first and second capping layers 116 and 128, for example, 30% to 70% of a total thickness T2 of the first and second capping layers 116 and 128 on the second region R2 of the substrate 100, etc., but is not limited thereto. According to at least one example embodiment, the "thickness" of an object may mean a vertical distance and/or length of the object measured in a direction perpendicular to the top surface of the substrate 100.

According to at least one example embodiment, a structure including the first and second capping layers 116 and 128 may be referred to as a 'capping structure'. In at least one example embodiment, the capping structure may include at least a first portion and a second portion, etc. The first portion of the capping structure may be provided on the first and second regions R1 and R2 of the substrate 100 and may cover the first interlayer insulating layer 110, but is not limited thereto. The second portion of the capping structure may be disposed on the protection insulating layer 124, which is located on the first region R1 of the substrate 100, etc. The second portion of the capping structure may conformally cover the top surface of the gapfill insulating pattern 126 and/or may cover at least a portion of the outer side surface of the uppermost portion of the protection insulating layer 124, but is not limited thereto. In addition, the second portion of the capping structure may conformally cover the side surface 126S of the gapfill insulating pattern 126, etc. The second portion of the capping structure may be formed (and/or etched) such that the top surface TEU of the top electrode TE is exposed. The second portion of the capping structure may include at least one second recess region 128R, which may be located between the data storage structures DS and may be recessed toward the substrate 100, but the example embodiments are not limited thereto. The second recess region 128R of the second portion of the capping structure may be filled with at least one third interlayer insulating layer 130, but is not limited thereto.

Hereinafter, the thickness T1 of the first capping layer 116 on the first region R1 of the substrate 100 will be referred to as the thickness T1 of the first portion of the capping structure on the first region R1 of the substrate 100. The total thickness T2 of the first and second capping layers 116 and 128 on the second region R2 of the substrate 100 will be referred to as a thickness T2 of the first portion of the capping structure on the second region R2 of the substrate 100. In at least one example embodiment, the thickness T1 of the first portion of the capping structure on the first region R1 of the substrate 100 may be, for example, about 30% to about 70% of the thickness T2 of the first portion of the capping structure on the second region R2 of the substrate 100, but the example embodiments are not limited thereto.

According to at least one example embodiment, in the case where, as described above, the thickness T1 of the first capping layer 116 on the first region R1 of the substrate 100 is smaller than the total thickness T2 of the first and second capping layers 116 and 128 on the second region R2 of the substrate 100, it may be possible to increase a process margin for decreasing the likelihood and/or preventing the first capping layer 116 from being exposed through the first recess region 120R. Accordingly, it may be possible to decrease and/or prevent a short circuit issue, which may occur when the first capping layer 116 is exposed, and thereby to reduce and/or decrease a unit cell size (e.g., physical size) of the magnetic memory device.

The third interlayer insulating layer 130 may be provided on the substrate 100 and may cover the first and second regions R1 and R2 of the substrate 100, but the example embodiments are not limited thereto. The third interlayer insulating layer 130 may be interposed between the second capping layer 128 and an upper capping layer 146, which will be described below. The third interlayer insulating layer 130 may be disposed on the second capping layer 128, which is on the first region R1 of the substrate 100, and the third interlayer insulating layer 130 may fill the second recess region 128R, etc., but is not limited thereto. The third interlayer insulating layer 130 may cover the second capping layer 128 on the side surface 126S, and may cover a top surface of the second capping layer 128 on the second region R2 of the substrate 100, but the example embodiments are not limited thereto. The third interlayer insulating layer 130 may be formed (and/or etched) such that the top surface TEU of the top electrode TE is exposed. The third interlayer insulating layer 130 may be formed of and/or include at least one of, for example, oxide, silicon oxide, and/or low-k dielectric materials, etc., but is not limited thereto. As an example, the third interlayer insulating layer 130 may be formed of and/or include a material whose dielectric constant (k) is lower than those of the second interlayer insulating layer 120 and/or the gapfill insulating pattern 126, but is not limited thereto. The third interlayer insulating layer 130 may be formed of and/or include a material which is different from the protection insulating layer 124 and/or the second capping layer 128, but the example embodiments are not limited thereto.

A fourth interlayer insulating layer 150 may be disposed on the third interlayer insulating layer 130, etc. The upper capping layer 146 may be interposed between the third and fourth interlayer insulating layers 130 and 150, but is not limited thereto. The third interlayer insulating layer 130 may be interposed between the second capping layer 128 and the upper capping layer 146, but is not limited thereto. The upper capping layer 146 and the fourth interlayer insulating layer 150 may cover the first and second regions R1 and R2 of the substrate 100, etc. The fourth interlayer insulating layer 150 may be formed of and/or include at least one of oxide, silicon oxide, and/or low-k dielectric materials, etc. As an example, the fourth interlayer insulating layer 150 may be formed of and/or include the same material as the third interlayer insulating layer 130, but the example embodiments are not limited thereto. As an example, the fourth interlayer insulating layer 150 may be formed of and/or include a material whose dielectric constant (k) is lower than those of the second interlayer insulating layer 120 and/or the gapfill insulating pattern 126, but the example embodiments are not limited thereto.

The upper capping layer 146 may be formed of and/or include a material which is different from the third and fourth interlayer insulating layers 130 and 150, but is not limited thereto. The upper capping layer 146 may be formed of and/or include a material having an etch selectivity the same as and/or similar to the third and fourth interlayer insulating layers 130 and 150, but the example embodiments are not limited thereto. The upper capping layer 146 may be formed of and/or include at least one nitride materials, e.g., silicon nitride, silicon carbonitride, etc.

At least one conductive contact 142 and/or at least one conductive pattern 144 may be disposed on the second region R2 of the substrate 100, but the example embodiments are not limited thereto. The conductive pattern 144 may be disposed on the conductive contact 142, but is not limited thereto. The conductive contact 142 may be disposed between the lower interconnection line 114 and the conductive pattern 144, but is not limited thereto. In at least one example embodiment, the conductive contact 142 and/or the conductive pattern 144 may be provided in plural, or in other words, there may be a plurality of conductive contacts 142 and/or a plurality of conductive patterns 144, etc. The conductive patterns 144 may be horizontally spaced apart from each other, but is not limited thereto. The conductive contacts 142 and/or the conductive patterns 144 may be disposed in and/or included in the third interlayer insulating layer 130, but is not limited thereto. Each of the conductive contacts 142 may penetrate the first capping layer 116, the second capping layer 128, and/or the third interlayer insulating layer 130, and may be electrically connected to a corresponding one of the lower interconnection lines 114, etc. Additionally, each of the conductive patterns 144 may be electrically connected to a corresponding one of the lower interconnection lines 114 through a corresponding one of the conductive contacts 142, etc. The conductive contacts 142 and the conductive patterns 144 may be formed of and/or include at least one conductive metallic materials, e.g., copper (Cu), etc.

At least one first upper interconnection line 152 may be disposed on the first region R1 of the substrate 100, but the example embodiments are not limited thereto. In at least one example embodiment, a plurality of the first upper interconnection lines 152 may be provided and may be horizontally spaced apart from each other, but are not limited thereto. Each of the first upper interconnection lines 152 may penetrate the fourth interlayer insulating layer 150, the upper capping layer 146, and/or the second capping layer 128, and may be electrically connected to a corresponding one of the data storage structures DS, etc., but the example embodiments are not limited thereto. The first upper interconnection line 152 may cover the top surface TEU of the top electrode TE, etc. The top surface TEU of the top electrode TE may be in contact with a bottom surface of the first upper interconnection line 152. The first upper interconnection line 152 may be formed of and/or include at least one of conductive metallic materials, e.g., copper (Cu), etc.

A second upper interconnection line 154 may be disposed on the second region R2 of the substrate 100, but is not limited thereto. In at least one example embodiment, a plurality of the second upper interconnection lines 154 may be provided, and may be horizontally spaced apart from each other. Each of the second upper interconnection lines 154 may penetrate the fourth interlayer insulating layer 150 and/or the upper capping layer 146, and may be electrically connected to a corresponding one of the conductive patterns 144, but the example embodiments are not limited thereto. In at least one example embodiment, a bottom surface of the second upper interconnection line 154 may be located at a level which is higher than the bottom surface of the first upper interconnection line 152 (e.g., the bottom surface of the second upper interconnection line 154 is higher than the bottom surface of the first upper interconnection line 152, etc.), but the example embodiments are not limited thereto.

FIGS. 5 to 16 are sectional views, which are taken along the line I-I' of FIG. 2 to illustrate a method of fabricating a magnetic memory device according to some example embodiments of the inventive concepts. For the sake of concise description, description of an element in at least one example embodiment of the magnetic memory device previously described with reference to FIGS. 1 to 3, 4A, and/or 4B and identified by the same reference number, will be omitted.

Figure 5:
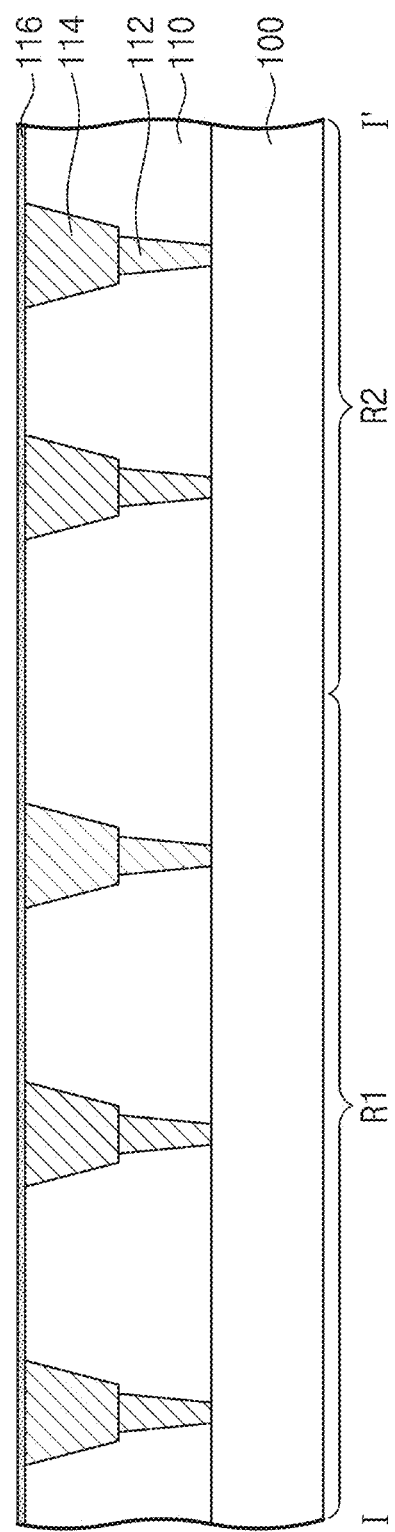
FIGS. 5 to 16 are sectional views, which are taken along the line I-I' of FIG. 2 to illustrate a method of fabricating a magnetic memory device according to at least one example embodiment of the inventive concepts.

Referring to FIG. 5, according to at least one example embodiment, a substrate 100 including at least a first and second regions R1 and R2 may be provided, but the example embodiments are not limited thereto. The selection elements (not shown) may be formed in the substrate 100. The first interlayer insulating layer 110 may be formed on the substrate 100 and may cover the first and second regions R1 and R2 of the substrate 100, but is not limited thereto. The first interlayer insulating layer 110 may be formed by performing a deposition process, such as an atomic layer deposition process, a chemical vapor deposition process, and/or a physical vapor deposition process, etc., but the example embodiments are not limited thereto.

The lower contacts 112 and lower interconnection lines 114 may be formed on the first and/or second regions R1 and R2 of the substrate 100, and may be formed in and/or included in the first interlayer insulating layer 110, but the example embodiments are not limited thereto. The formation of the lower contacts 112 and the lower interconnection lines 114 may include forming and/or etching penetration holes to penetrate the first interlayer insulating layer 110, and filling the penetration holes with a conductive layer, etc., but the example embodiments are not limited thereto. The top surfaces of the lower interconnection lines 114 may be coplanar and/or substantially coplanar with the top surface of the first interlayer insulating layer 110 (e.g., may be coplanar within +/−10% of the top surface of the first interlayer insulating layer 110), but the example embodiments are not limited thereto.

The first capping layer 116 may be formed on the first interlayer insulating layer 110, and may cover the first and/or second regions R1 and R2 of the substrate 100, etc. The first capping layer 116 may be formed to conform to the first interlayer insulating layer 110, but is not limited thereto. The first capping layer 116 may be formed by performing a deposition process, such as an atomic layer deposition process, a chemical vapor deposition process, and/or a physical vapor deposition process, etc.

Figure 6:
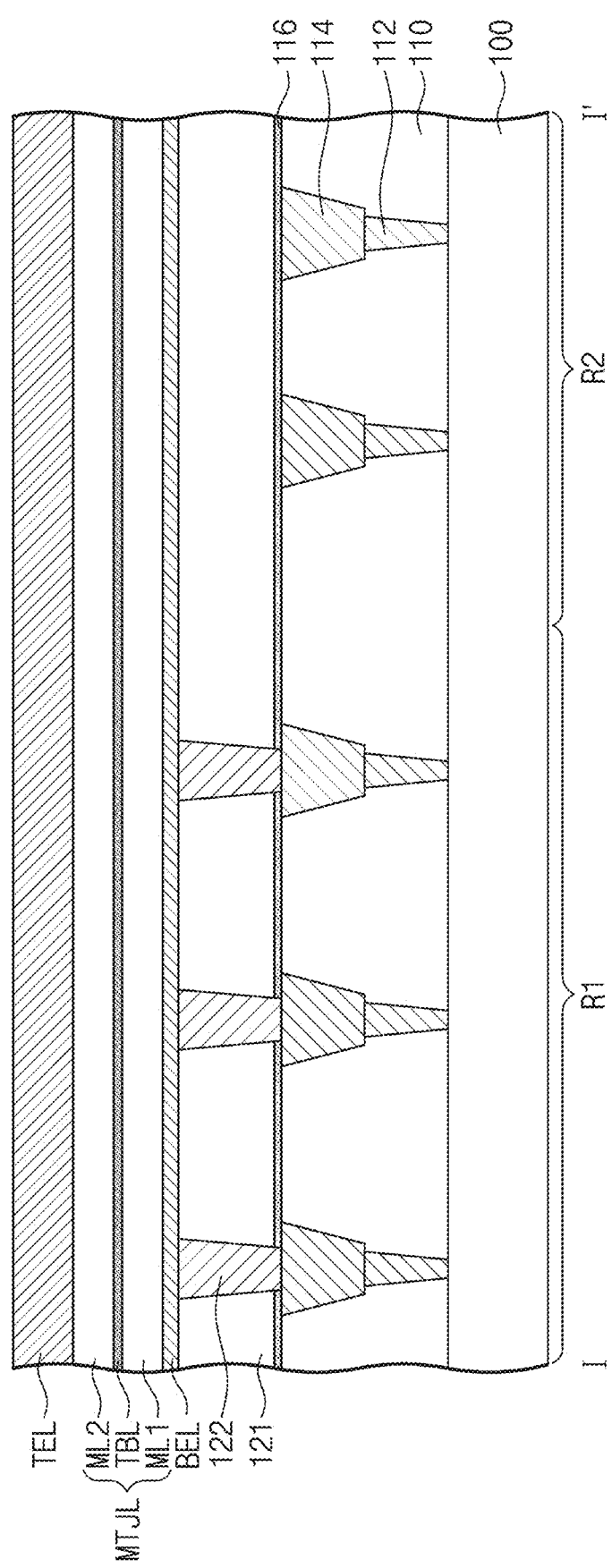

Referring to FIG. 6, a preliminary insulating layer 121 may be formed on the first capping layer 116, but is not limited thereto. The preliminary insulating layer 121 may be formed and may cover the first and second regions R1 and R2 of the substrate 100, etc. The preliminary insulating layer 121 may be formed by performing a deposition process, such as an atomic layer deposition process, a chemical vapor deposition process, and/or a physical vapor deposition process, etc. The preliminary insulating layer 121 may be formed of and/or include at least one of, for example, oxide and/or silicon oxide, etc., but is not limited thereto.

At least one bottom electrode contact 122 may be formed on the first region R1 of the substrate 100. The bottom electrode contact 122 may penetrate the preliminary insulating layer 121 and/or the first capping layer 116 and may be electrically connected to a corresponding one of the lower interconnection lines 114, but the example embodiments are not limited thereto. The formation of the bottom electrode contact 122 may include forming (and/or etching) a lower contact hole to penetrate the preliminary insulating layer 121 and/or the first capping layer 116, filling the lower contact hole with a conductive layer, and performing a planarization process to expose a top surface of the preliminary insulating layer 121, but the example embodiments are not limited thereto. As a result of the planarization process, the top surface of the bottom electrode contact 122 may be coplanar and/or substantially coplanar with the top surface of the preliminary insulating layer 121 (e.g., may be coplanar within +/−10% of the top surface of the first interlayer insulating layer 110), and the top surface of the bottom electrode contact 122 may not be covered with the preliminary insulating layer 121 and therefore may be exposed to the outside, etc.

A bottom electrode layer BEL, a magnetic tunnel junction layer MTJL, and/or a top electrode layer TEL may be sequentially formed on the preliminary insulating layer 121, but the example embodiments are not limited thereto. The bottom electrode layer BEL may be formed and may cover the top surface of the bottom electrode contact 122 and/or the top surface of the preliminary insulating layer 121. Each of the bottom electrode layer BEL, the magnetic tunnel junction layer MTJL, and/or the top electrode layer TEL may cover the first and/or second regions R1 and R2 of the substrate 100, but the example embodiments are not limited thereto. The magnetic tunnel junction layer MTJL may include at least a first magnetic layer ML1, a tunnel barrier layer TBL, and/or a second magnetic layer ML2, and the first magnetic layer ML1, a tunnel barrier layer TBL, and/or a second magnetic layer ML2 may be sequentially stacked on the bottom electrode layer BEL, but the example embodiments are not limited thereto. Each of the first magnetic layer ML1 and the second magnetic layer ML2 may include at least one magnetic layer, but are not limited thereto. The first magnetic layer ML1, the tunnel barrier layer TBL, and/or the second magnetic layer ML2 may be formed using, for example, a sputtering process, a chemical vapor deposition process, and/or an atomic layer deposition process, etc.

Figure 7:
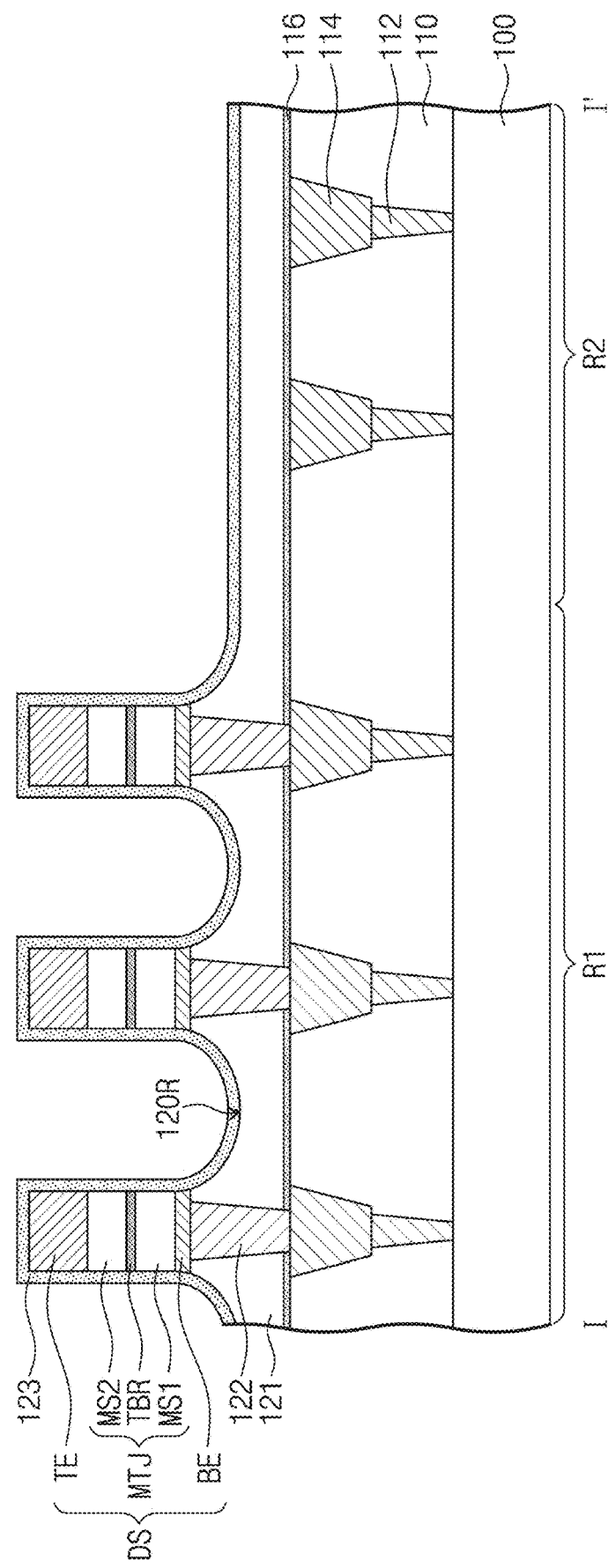

Referring to FIG. 7, the top electrode layer TEL, the magnetic tunnel junction layer MTJL, and/or the bottom electrode layer BEL may be patterned, but the example embodiments are not limited thereto. As a result of the patterning process, the top electrode layer TEL, the magnetic tunnel junction layer MTJL, and/or the bottom electrode layer BEL may be etched to form the top electrode TE, the magnetic tunnel junction pattern MTJ, and/or the bottom electrode BE, respectively, on the first region R1 of the substrate 100, etc. The top electrode TE, the magnetic tunnel junction pattern MTJ, and/or the bottom electrode BE may constitute and/or may be included in the data storage structure DS, but the example embodiments are not limited thereto. The patterning process may include forming a mask pattern (not shown) on the top electrode layer TEL and performing an etching process using the mask pattern as an etch mask, etc. In at least one example embodiment, the etching process may be an ion beam etching process using an ion beam, but the example embodiments are not limited thereto. The ion beam may include inert or inactive ions, etc.

According to at least one example embodiment, the bottom electrode BE may be electrically connected to the bottom electrode contact 122, and the magnetic tunnel junction pattern MTJ may be formed on the bottom electrode BE, etc. The magnetic tunnel junction pattern MTJ may include the first magnetic structure MS1, the tunnel barrier pattern TBR, and/or the second magnetic structure MS2, and the first magnetic structure MS1, the tunnel barrier pattern TBR, and/or the second magnetic structure MS2 may be sequentially stacked on the bottom electrode BE, but the example embodiments are not limited thereto. The first and second magnetic structures MS1 and MS2 may be spaced apart from each other with the tunnel barrier pattern TBR interposed therebetween, but the example embodiments are not limited thereto. The etching of the magnetic tunnel junction layer MTJL may include sequentially etching the second magnetic layer ML2, the tunnel barrier layer TBL, and/or the first magnetic layer ML1 using the mask pattern as an etch mask, but is not limited thereto. The second magnetic structure MS2, the tunnel barrier pattern TBR, and/or the first magnetic structure MS1 may be respectively formed, as a result of the etching of the second magnetic layer ML2, the tunnel barrier layer TBL, and/or the first magnetic layer ML1, etc.

The patterning process may be performed to recess (e.g., etch away) upper portions of the preliminary insulating layer 121 at both sides of the magnetic tunnel junction pattern MTJ, but the example embodiments are not limited thereto. Accordingly, the preliminary insulating layer 121 may include the first recess regions 120R, which are recessed toward the substrate 100, at both sides of the magnetic tunnel junction pattern MTJ, but the example embodiments are not limited thereto. Furthermore, an upper portion of the preliminary insulating layer 121 on the second region R2 of the substrate 100 may also be recessed during the patterning process. Accordingly, the top surface of the preliminary insulating layer 121 on the second region R2 of the substrate 100 may be located at a level which is lower than the top surface of the bottom electrode contact 122 (e.g., the top surface of the preliminary insulating layer 121 on the second region R2 of the substrate 100 may be lower than the top surface of the bottom electrode contact 122, etc.), but the example embodiments are not limited thereto.

A preliminary protection insulating layer 123 may be formed on the first and/or second regions R1 and R2 of the substrate 100, but is not limited thereto. The preliminary protection insulating layer 123 may be formed on the preliminary insulating layer 121, and may cover the data storage structure DS, etc. The preliminary protection insulating layer 123 may be formed to conformally cover the top and side surfaces of the data storage structure DS, but is not limited thereto. The preliminary protection insulating layer 123 may be extended along an inner surface of the first recess region 120R of the preliminary insulating layer 121 to conformally cover the inner surface of the first recess region 120R, but is not limited thereto. The preliminary protection insulating layer 123 may be extended along the top surface of the preliminary insulating layer 121 on the second region R2 of the substrate 100, etc. The preliminary protection insulating layer 123 may be formed of and/or include at least one insulating materials, e.g., silicon nitride, silicon oxynitride, silicon carbonitride, silicon carbon oxynitride, aluminum oxide, and/or aluminum nitride, etc. The preliminary protection insulating layer 123 may be formed to decrease and/or prevent the side surfaces of the magnetic tunnel junction pattern MTJ from being oxidized during a subsequent process.

Figure 8:
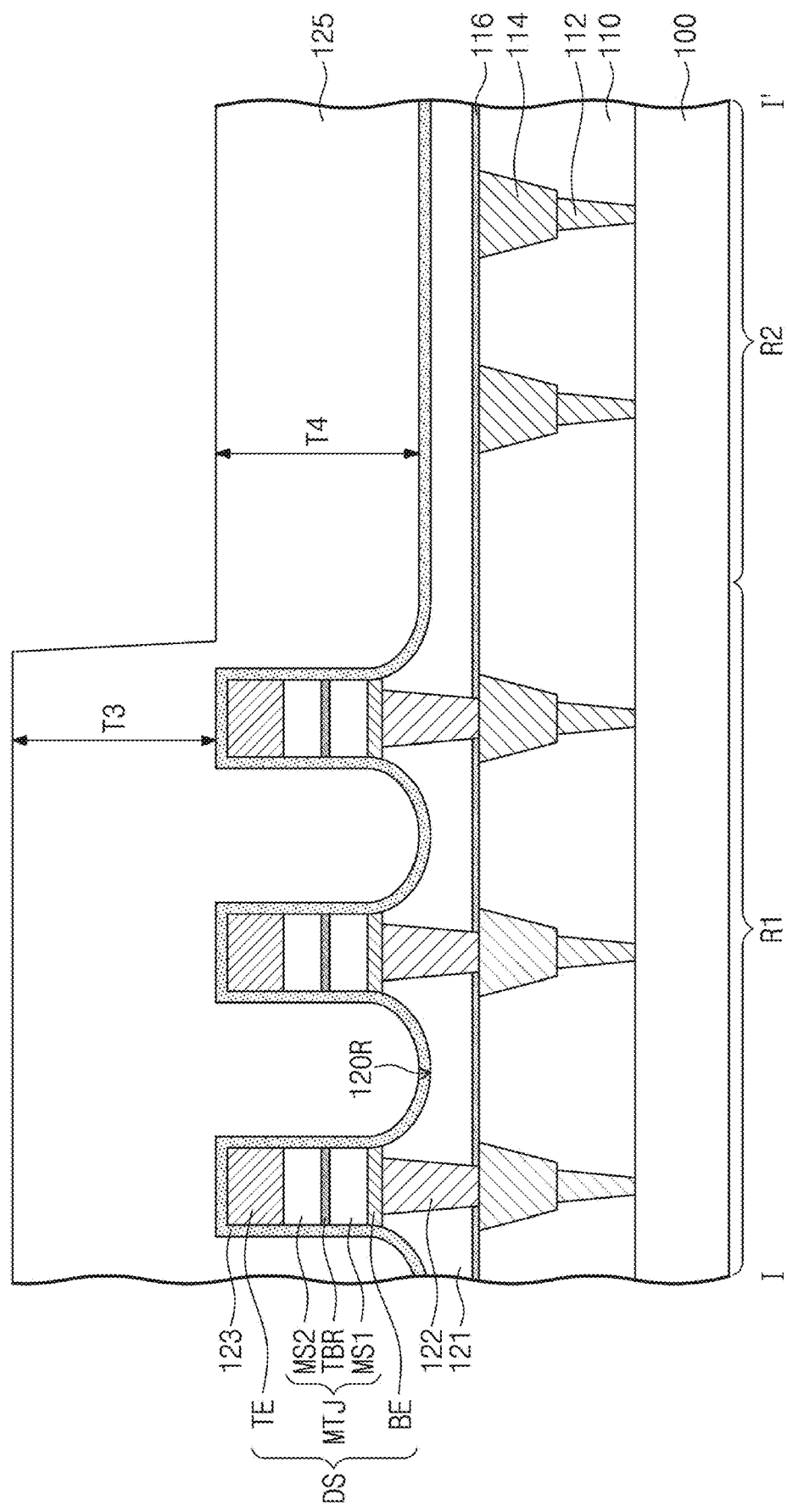

Referring to FIG. 8, according to at least one example embodiment, an insulating gapfill layer 125 may be formed on the first and/or second regions R1 and R2 of the substrate 100, but the example embodiments are not limited thereto. The insulating gapfill layer 125 may be formed on the preliminary protection insulating layer 123 to cover the data storage structure DS, etc. The insulating gapfill layer 125 may be formed to fill a remaining portion of the first recess region 120R, but is not limited thereto. The insulating gapfill layer 125 may cover the preliminary protection insulating layer 123 on the second region R2 of the substrate 100, but is not limited thereto. The insulating gapfill layer 125 may be formed by performing a deposition process, such as an atomic layer deposition process, a chemical vapor deposition process, and/or a physical vapor deposition process, etc. The insulating gapfill layer 125 may be formed of and/or include at least one of, for example, oxide and/or silicon oxide, etc., but is not limited thereto. A top surface of the insulating gapfill layer 125 on the first region R1 of the substrate 100 may be located at a level which is higher than a top surface of the insulating gapfill layer 125 on the second region R2 of the substrate 100 (e.g., the top surface of the insulating gapfill layer 125 on the first region R1 of the substrate 100 may be higher than a top surface of the insulating gapfill layer 125 on the second region R2 of the substrate 100, etc.), but the example embodiments are not limited thereto. In at least one example embodiment, a thickness T3 of the preliminary protection insulating layer 123, which is located on the first region R1 of the substrate 100 (e.g., on the data storage structure DS), may be equal to and/or substantially equal to a thickness T4 of the preliminary protection insulating layer 123 on the second region R2 of the substrate 100 (e.g., may be within +/−10% of the thickness of the preliminary protection insulating layer 123). In at least one example embodiment, the preliminary protection insulating layer 123 may be thickly formed, and in this case, the remaining portion of the first recess region 120R may be easily filled with the insulating gapfill layer 125, etc.

Figure 9:
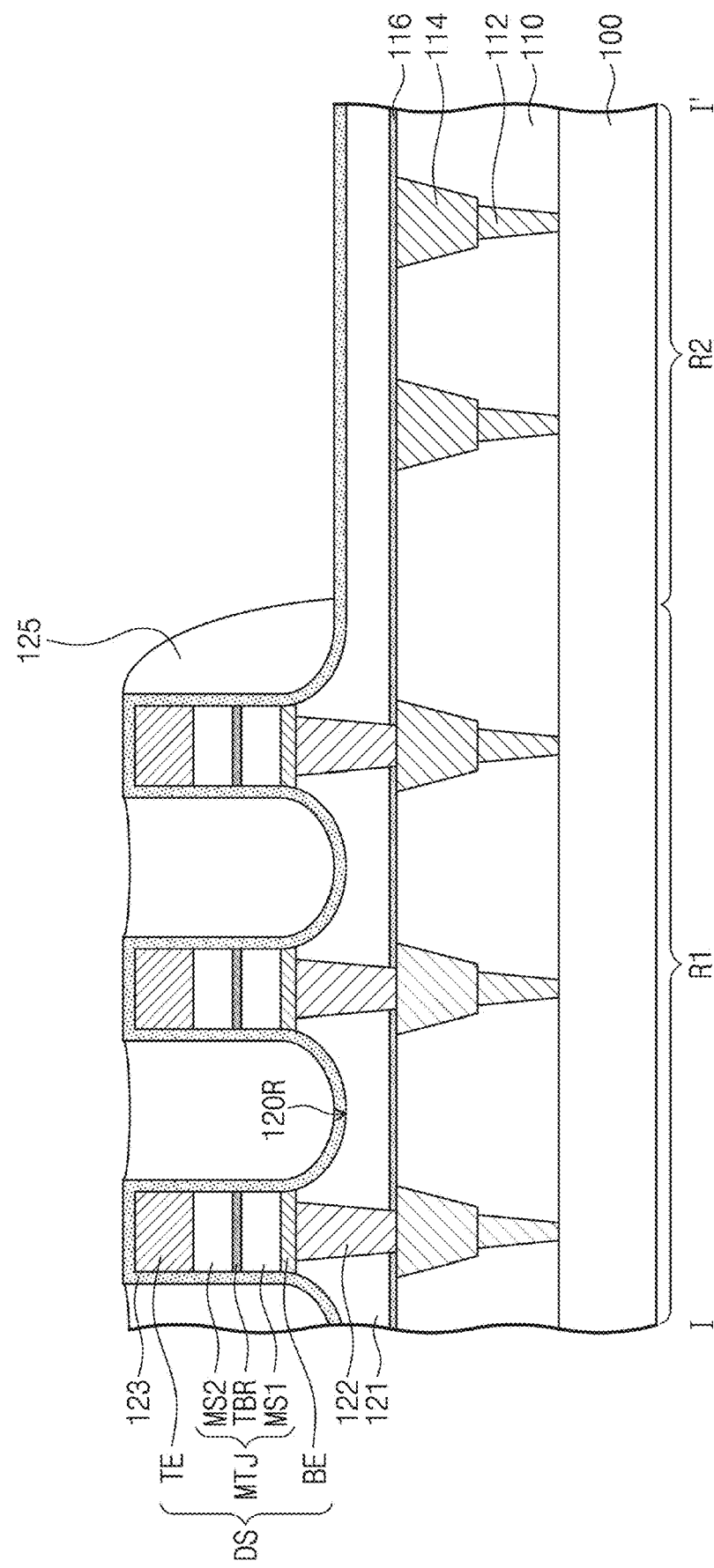

Referring to FIG. 9, according to at least one example embodiment, the insulating gapfill layer 125 may be etched and/or partially etched to expose at least a portion of a top surface of the preliminary protection insulating layer 123, etc. For example, an etching process may be performed to expose the top surface of the preliminary protection insulating layer 123 on the first region R1 of the substrate 100 (e.g., on the data storage structures DS) and to expose the top surface of the preliminary protection insulating layer 123 on the second region R2 of the substrate 100, but the example embodiments are not limited thereto. For example, the etching process may include an etch-back process, etc., but is not limited thereto. In at least one example embodiment, a top surface of the insulating gapfill layer 125 between the data storage structures DS may be located at a level which is lower than and/or substantially equal to a top surface of the preliminary protection insulating layer 123 on the data storage structures DS (e.g., may be within +/−10% of the top surface of the preliminary protection insulating layer 123).

Figure 10:
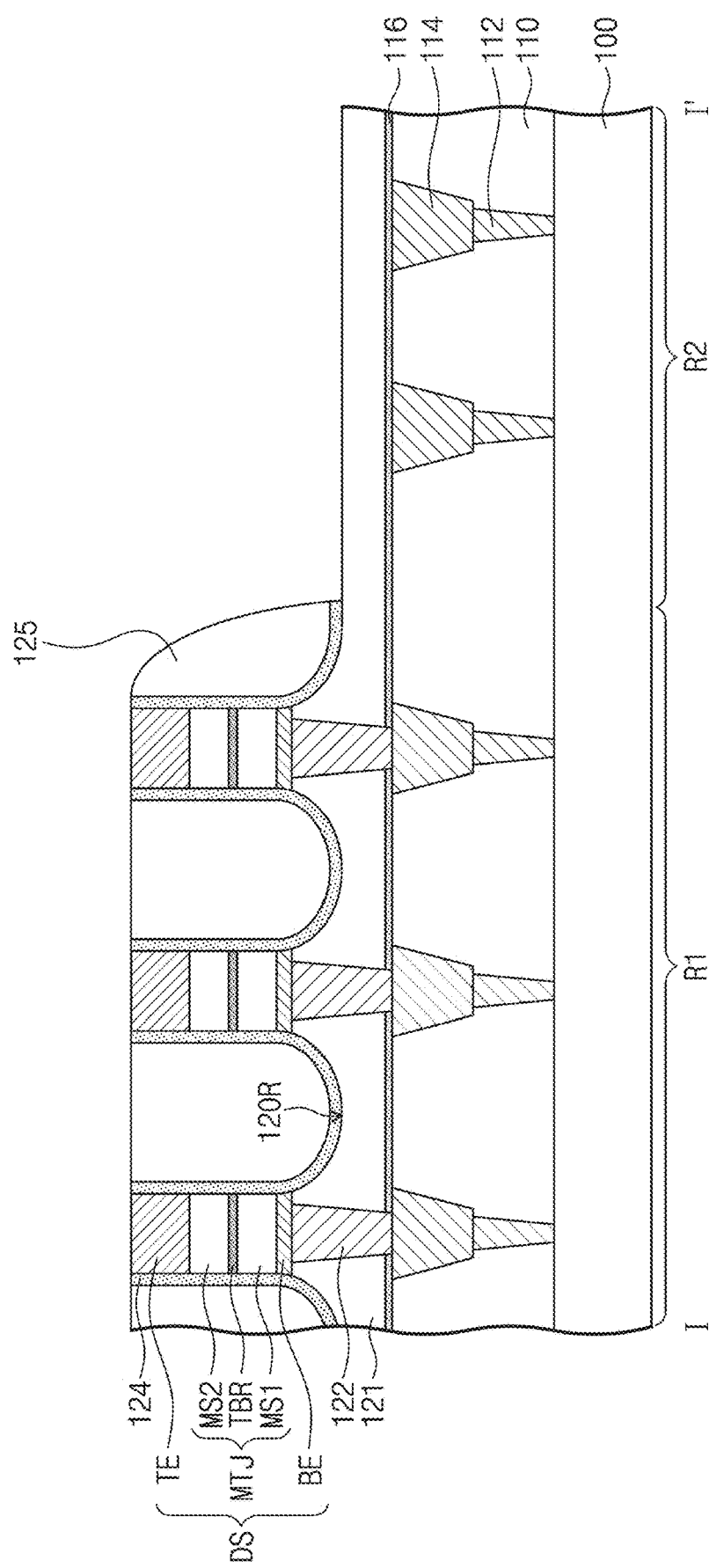

Referring to FIG. 10, according to at least one example embodiment, the protection insulating layer 124 may be formed by etching at least a portion of the preliminary protection insulating layer 123, etc. In at least one example embodiment, the etching process may be performed to expose a top surface of the top electrode TE on the first region R1 of the substrate 100, and/or to expose the top surface of the preliminary insulating layer 121 on the second region R2 of the substrate 100, etc. In at least one example embodiment, the etching process may be performed in an etch-back manner, but is not limited thereto.

Figure 11:
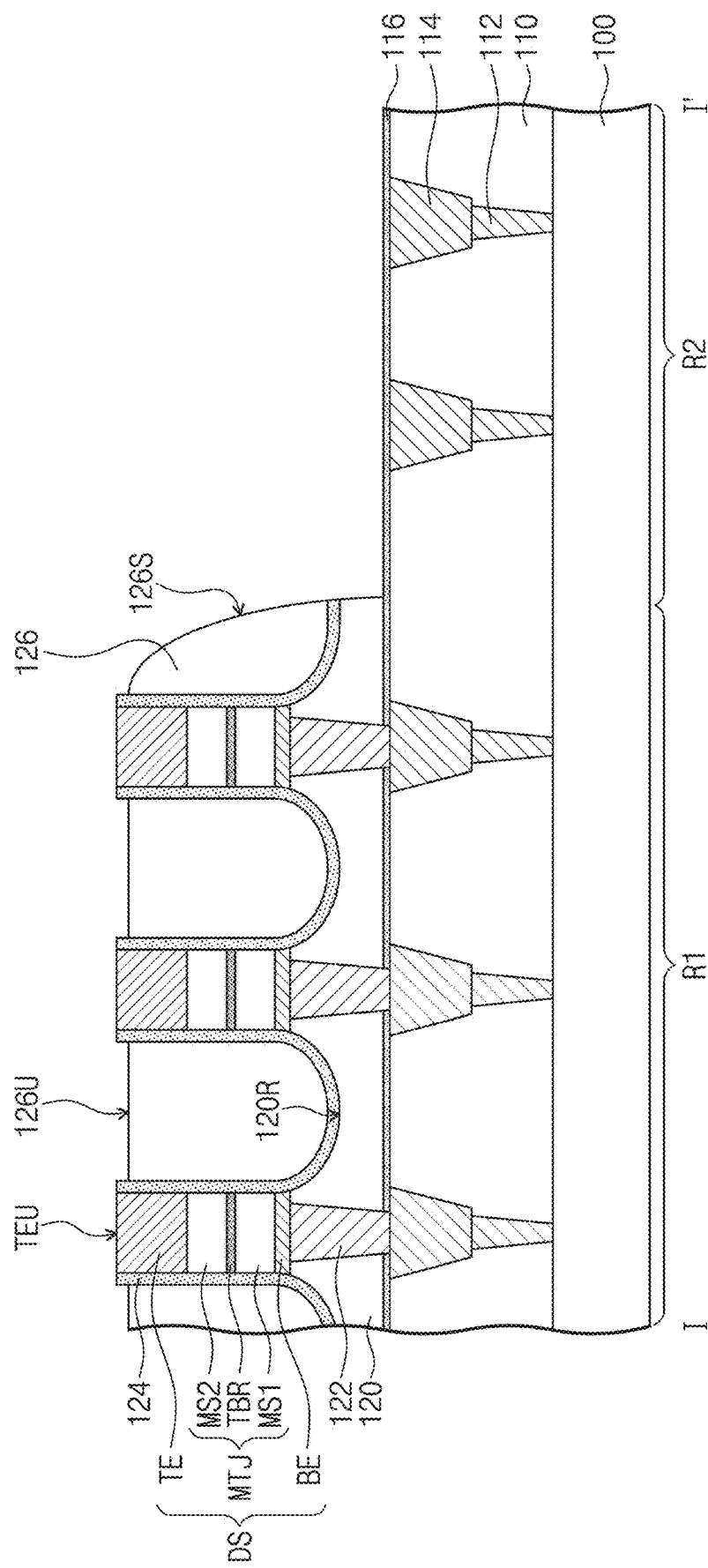

Referring to FIG. 11, according to at least one example embodiment, the gapfill insulating pattern 126 may be formed by etching at least a portion of the insulating gapfill layer 125, etc. In at least one example embodiment, the etching process may be performed to expose at least a portion of an outer side surface of the uppermost portion of the protection insulating layer 124 on the first region R1 of the substrate 100 (e.g., adjacent to the top surface TEU of the top electrode TE), but the example embodiments are not limited thereto. Accordingly, the top surface 126U of the gapfill insulating pattern 126 may be located at a level lower than the top surface TEU of the top electrode TE (e.g., the top surface 126U of the gapfill insulating pattern 126 may be lower than the top surface TEU of the top electrode TE, etc.), but is not limited thereto.

Furthermore, during the etching process, at least a portion of the preliminary insulating layer 121 may be etched to form the second interlayer insulating layer 120, but the example embodiments are not limited thereto. For example, the etching process may be performed to expose the top surface of the first capping layer 116 on the second region R2 of the substrate 100, etc.

As a result of the etching process, the side surface 126S of the gapfill insulating pattern 126 adjacent to the second region R2 of the substrate 100 may be etched to include an inclined angle, but the example embodiments are not limited thereto. The side surface 126S of the gapfill insulating pattern 126 may be formed to face the second region R2 of the substrate 100, and an angle between the side surface 126S and the top surface of the substrate 100 may gradually increase as the distance to the substrate 100 decreases, but the example embodiments are not limited thereto. As an example, the side surface 126S of the gapfill insulating pattern 126 may have an upwardly convex shape, but the example embodiments are not limited thereto. According to at least one example embodiment of the inventive concepts, it may be possible to expose the top surface of the first capping layer 116 on the second region R2 of the substrate 100, without performing an additional patterning process (e.g., including a photolithography operation, etc.), before a subsequent process to form the third interlayer insulating layer 130, etc. Thus, the fabrication process may be simplified and/or may be performed in a more cost-effective manner, and a fabrication efficiency may be increased with less manufacturing failures. Furthermore, since the side surface 126S of the gapfill insulating pattern 126 has an upwardly convex shape, the fabrication process may be performed in a more stable manner resulting in less defective semiconductor devices.

Figure 12:
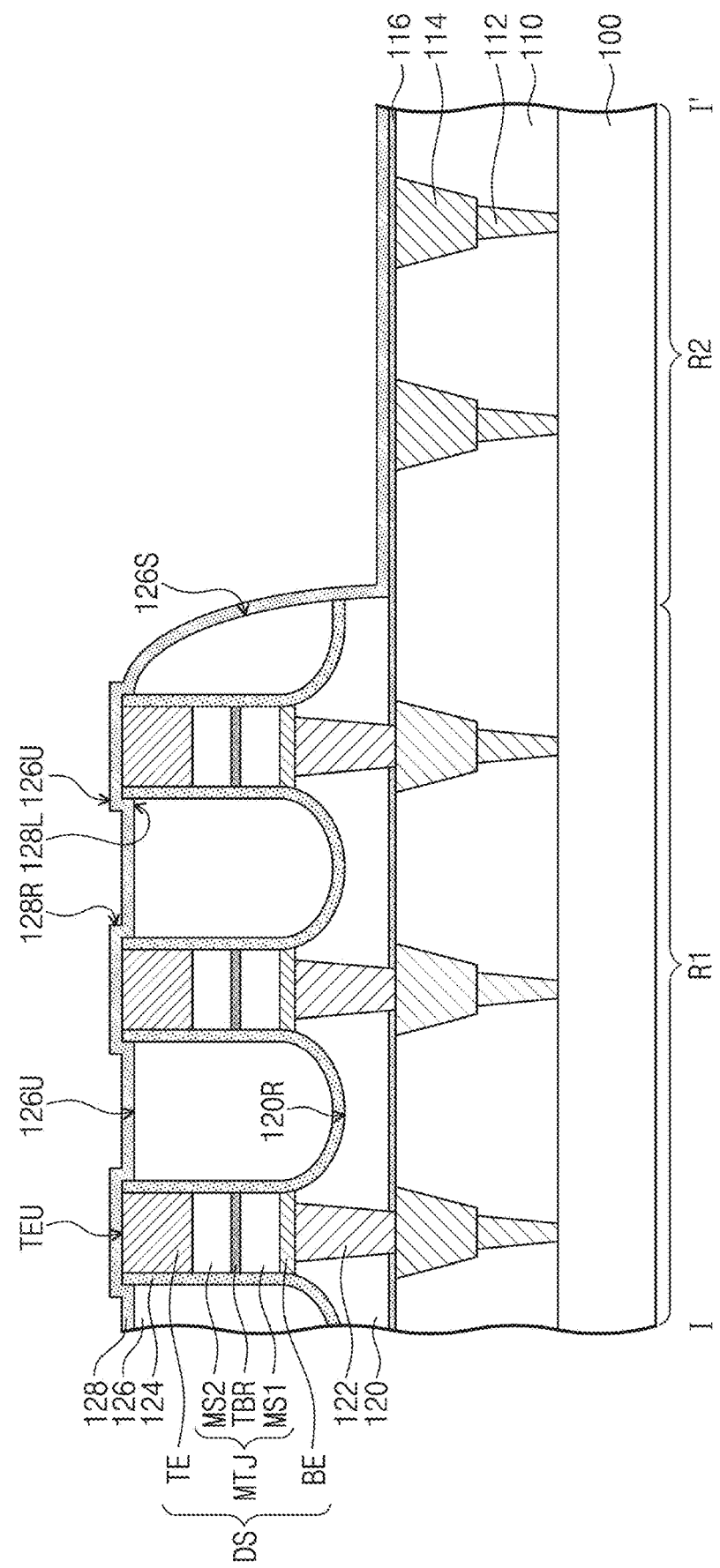

Referring to FIG. 12, according to at least one example embodiment, the second capping layer 128 may be formed on the first and/or second regions R1 and R2 of the substrate 100, etc. On the first region R1 of the substrate 100, the second capping layer 128 may conformally cover the top surface of the gapfill insulating pattern 126 and the top surface TEU of the top electrode TE, and may cover at least a portion of the outer side surface of the uppermost portion of the protection insulating layer 124, but the example embodiments are not limited thereto. The second capping layer 128 may conformally cover the side surface 126S of the gapfill insulating pattern 126 on the first region R1 of the substrate 100, and may be extended to conformally cover the top surface of the first capping layer 116 on the second region R2 of the substrate 100, but the example embodiments are not limited thereto. Since the top surface 126U of the gapfill insulating pattern 126 is located at a level lower than the top surface TEU of the top electrode TE, the second capping layer 128 may have and/or include the second recess region 128R, which is formed between the data storage structures DS and is recessed toward the substrate 100, etc. Accordingly, the second capping layer 128 on the first region R1 of the substrate 100 may have an uneven shape, but is not limited thereto.

Figure 13:
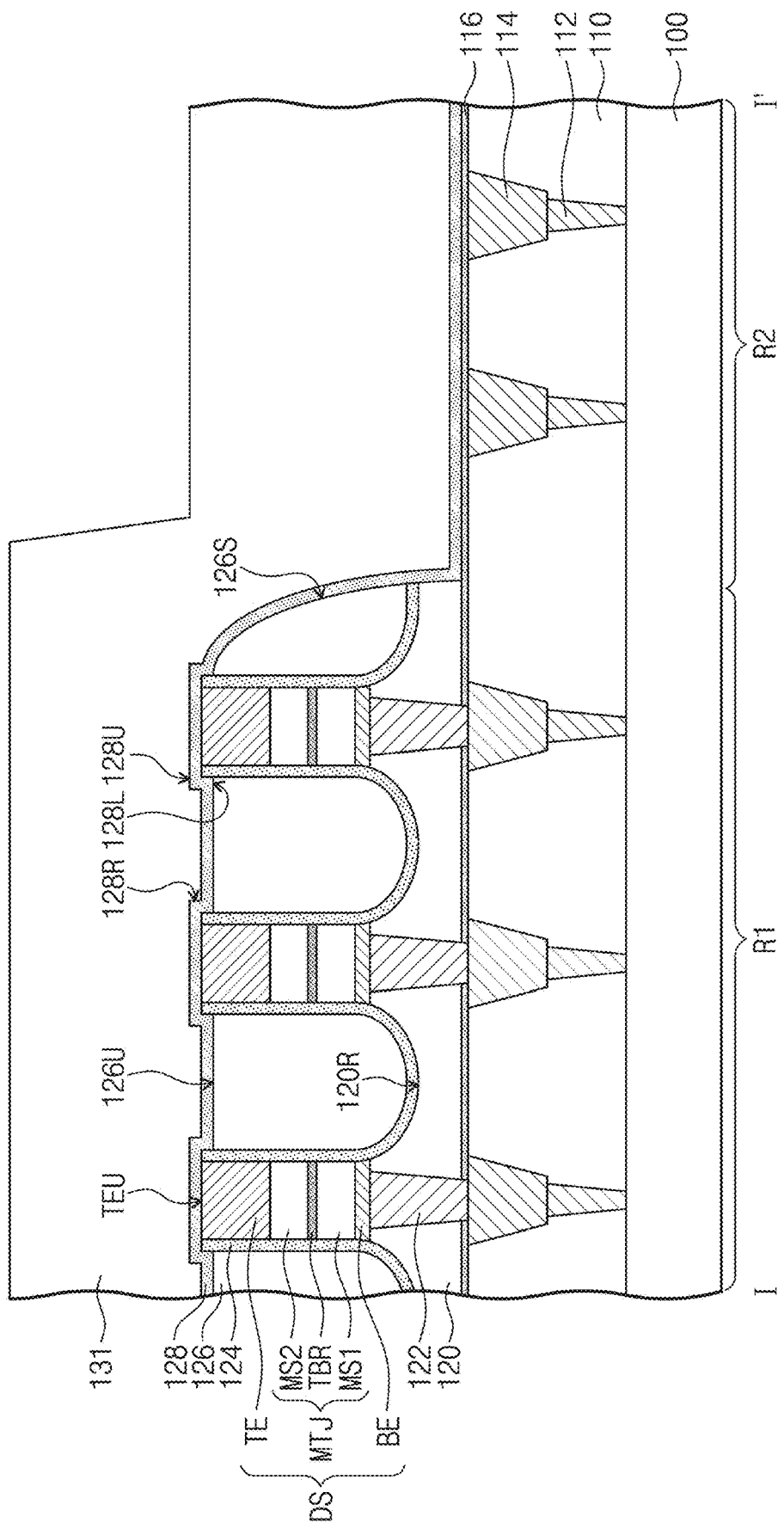

Referring to FIG. 13, according to at least one example embodiment, at least one first preliminary interlayer insulating layer 131 may be formed on the first and/or second regions R1 and R2 of the substrate 100, but the example embodiments are not limited thereto. The first preliminary interlayer insulating layer 131 may cover the second capping layer 128, etc. For example, the first preliminary interlayer insulating layer 131 may be formed on the first region R1 of the substrate 100, and may cover the second capping layer 128 and/or may fill the second recess region 128R, but is not limited thereto. In at least one example embodiment, the first preliminary interlayer insulating layer 131 may be formed to cover a curved surface of the second capping layer 128 on the side surface 126S and/or a top surface of the second capping layer 128 on the second region R2 of the substrate 100, but is not limited thereto. A top surface of the first preliminary interlayer insulating layer 131 on the first region R1 of the substrate 100 may be located at a level higher than a top surface of the first preliminary interlayer insulating layer 131 on the second region R2 of the substrate 100 (e.g., the top surface of the first preliminary interlayer insulating layer 131 on the first region R1 of the substrate 100 may be higher than a top surface of the first preliminary interlayer insulating layer 131 on the second region R2 of the substrate 100, etc.), but the example embodiments are not limited thereto. The first preliminary interlayer insulating layer 131 may be formed by performing a deposition process, such as an atomic layer deposition process, a chemical vapor deposition process, and/or a physical vapor deposition process, etc. The first preliminary interlayer insulating layer 131 may be formed of and/or include at least one of, for example, oxide, silicon oxide, and/or low-k dielectric materials, etc.

Figure 14:
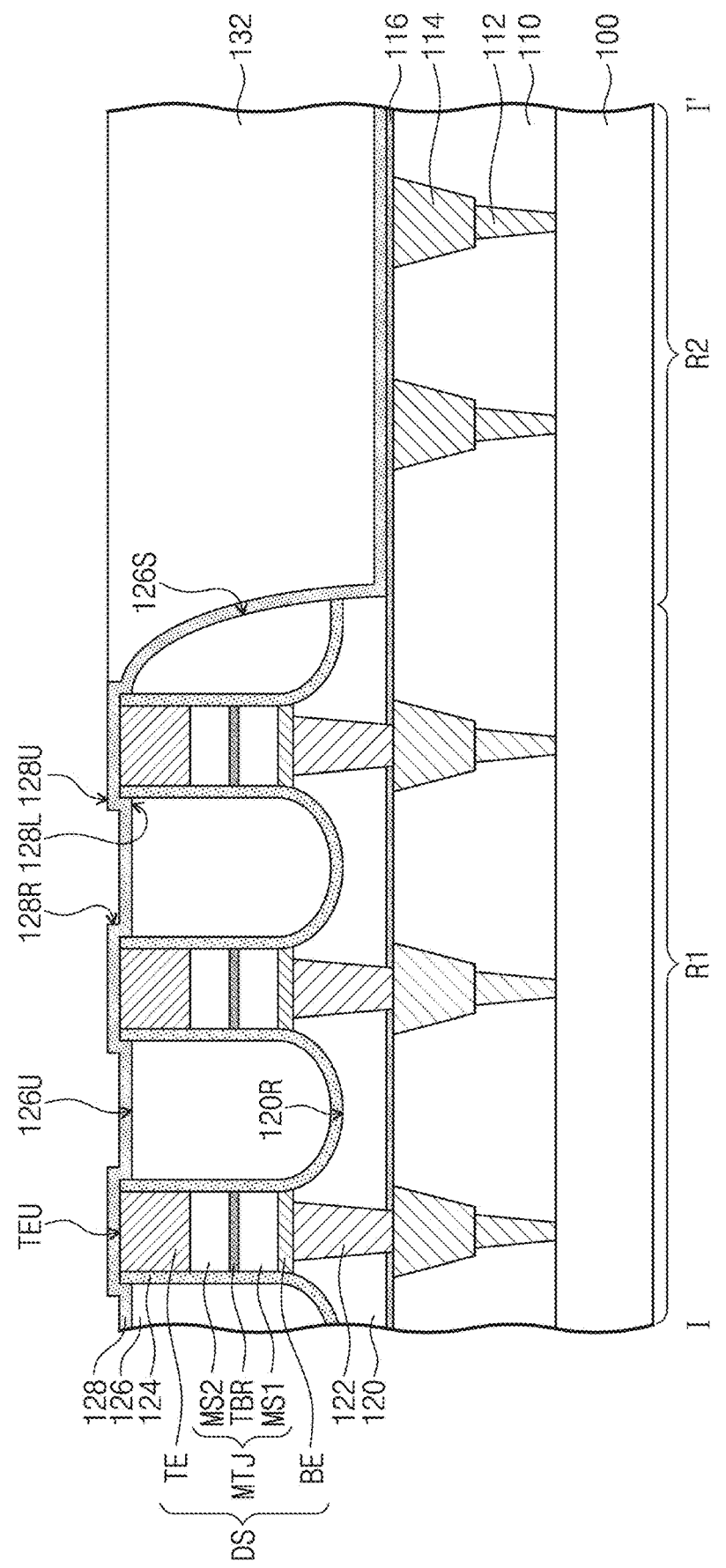

Referring to FIG. 14, according to at least one example embodiment, at least one interlayer insulating pattern 132 may be formed by etching at least a portion of the first preliminary interlayer insulating layer 131, but is not limited thereto. The formation of the interlayer insulating pattern 132 may include etching the first preliminary interlayer insulating layer 131 on the first region R1 of the substrate 100 and performing a planarization process on the resulting structure, but the example embodiments are not limited thereto. The etching process may be performed to expose a top surface of the second capping layer 128 on the first region R1 of the substrate 100, etc.

Figure 15:
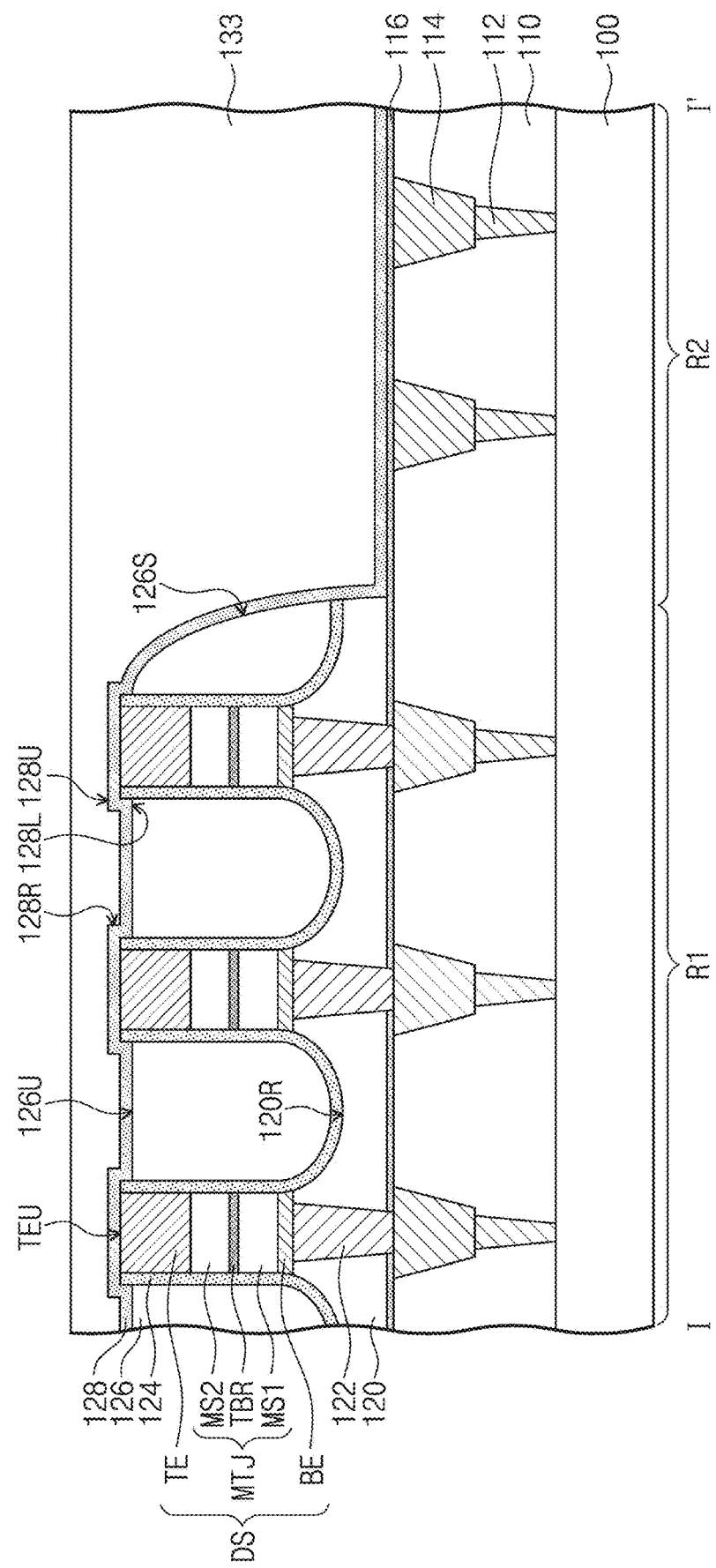

Referring to FIG. 15, according to at least one example embodiment, at least one insulating layer may be formed to cover the first and/or second regions R1 and R2 of the substrate 100, etc., but the example embodiments are not limited thereto. The insulating layer may be formed on the interlayer insulating pattern 132 and/or on the exposed top surface of the second capping layer 128, which is located on the first region R1 of the substrate 100, but is not limited thereto. The insulating layer may be formed of and/or include the same material as the first preliminary interlayer insulating layer 131, but the example embodiments are not limited thereto. Accordingly, the insulating layer and the interlayer insulating pattern 132 may form a single object which does not have any observable interface therein, but the example embodiments are not limited thereto. Hereinafter, the insulating layer and the interlayer insulating pattern 132 may be referred to as a second preliminary interlayer insulating layer 133. According to at least one example embodiment, the second preliminary interlayer insulating layer 133 may be formed to cover the second capping layer 128 on the first region R1 of the substrate 100 and/or to fill the second recess region 128R, but is not limited thereto. The second preliminary interlayer insulating layer 133 may be performed by a deposition process, such as an atomic layer deposition process, a chemical vapor deposition, and/or a physical vapor deposition, etc.

According to at least one example embodiment of the inventive concepts, the operations of forming the first preliminary interlayer insulating layer 131 and/or the interlayer insulating pattern 132 may be omitted, unlike the structure illustrated in FIGS. 13 and 14, but the example embodiments are not limited thereto. In this case, the second preliminary interlayer insulating layer 133 may be directly formed on the second capping layer 128 as described with reference to FIG. 12, but the example embodiments are not limited thereto. The second preliminary interlayer insulating layer 133 may be formed in the same manner as described above.

Figure 16:
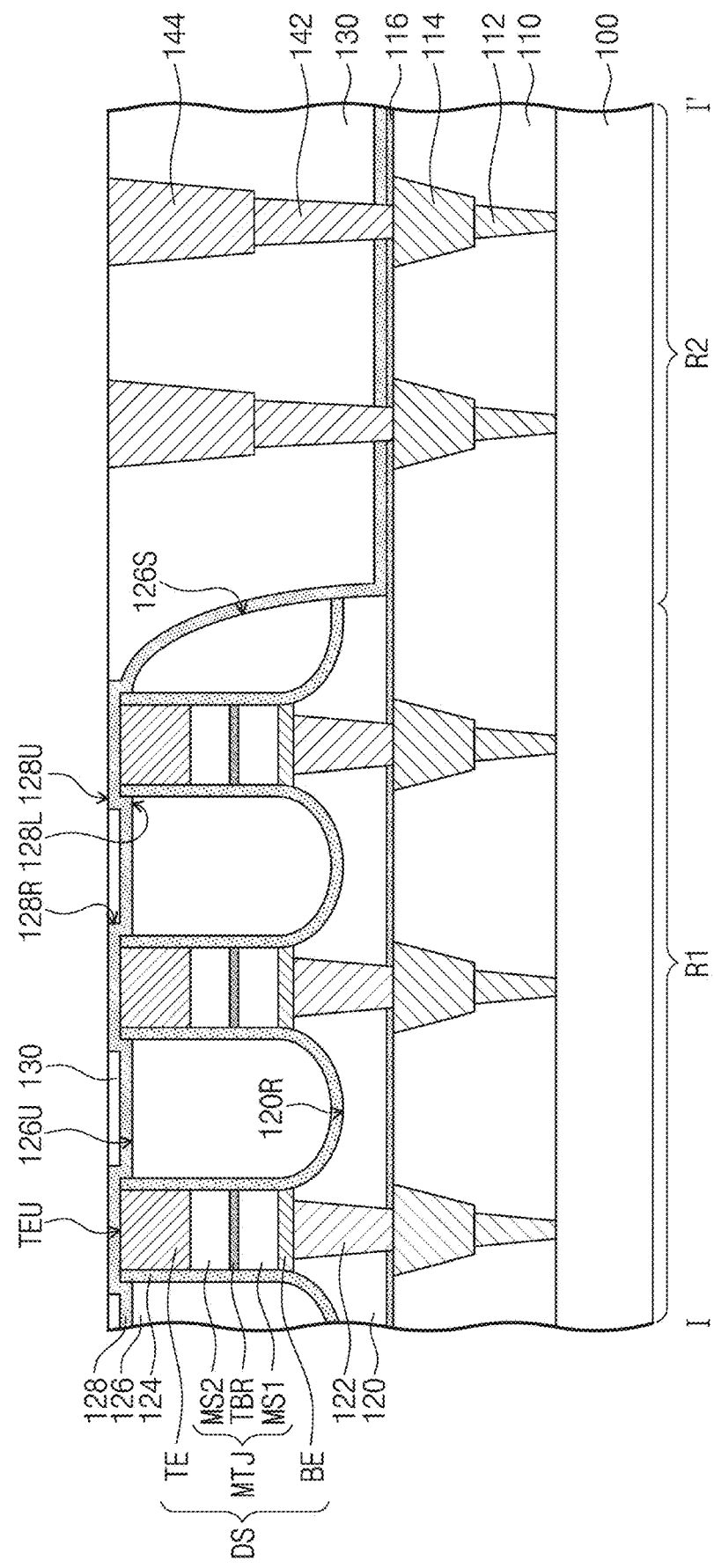

Referring to FIG. 16, according to at least one example embodiment, the conductive contact 142 and/or the conductive pattern 144 may be formed on the second region R2 of the substrate 100, but is not limited thereto. The conductive contact 142 and/or the conductive pattern 144 may penetrate the second preliminary interlayer insulating layer 133, etc. The conductive contact 142 may penetrate the second capping layer 128 and/or the first capping layer 116, and may be electrically connected to a corresponding lower interconnection line of the plurality of lower interconnection lines 114, etc. The formation of the conductive contact 142 and the conductive pattern 144 may include forming (and/or etching) a contact hole which penetrates the second preliminary interlayer insulating layer 133, the second capping layer 128, and/or the first capping layer 116, etc., filling the contact hole with a conductive layer, and/or performing a planarization process on the conductive layer, but the example embodiments are not limited thereto. In the planarization process, at least a portion of the second preliminary interlayer insulating layer 133 may be etched to form the third interlayer insulating layer 130, which exposes the uppermost surface 128U of the second capping layer 128 on the top electrode TE. Furthermore, the planarization process may be performed to leave at least one portion of the second preliminary interlayer insulating layer 133 in the second recess region 128R, and in this case, the third interlayer insulating layer 130 may include the left portions of the second preliminary interlayer insulating layer 133, but the example embodiments are not limited thereto. Accordingly, a top surface of the third interlayer insulating layer 130 may be coplanar and/or substantially coplanar with the uppermost surface 128U of the second capping layer 128 on the top electrode TE (e.g., may be coplanar within +/−10% of the uppermost surface 128U), but the example embodiments are not limited thereto.

Referring back to FIG. 3, the upper capping layer 146 and the fourth interlayer insulating layer 150 may be sequentially formed on the third interlayer insulating layer 130, but the example embodiments are not limited thereto. The upper capping layer 146 and the fourth interlayer insulating layer 150 may be formed to cover the first and second regions R1 and/or R2 of the substrate 100, etc. The upper capping layer 146 and the fourth interlayer insulating layer 150 may be formed by performing a deposition process, such as an atomic layer deposition process, a chemical vapor deposition process, and/or a physical vapor deposition process, etc.

At least one first etching process may be performed to etch the fourth interlayer insulating layer 150 and/or the upper capping layer 146 on the first region R1 of the substrate 100, etc. In at least one example embodiment, the first etching process may be performed to expose the second capping layer 128, and thereafter, at least one second etching process may be performed on the exposed portion of the second capping layer 128 to form at least one first trench. The first trench may be formed to expose the top surface TEU of the top electrode TE, but is not limited thereto. The fourth interlayer insulating layer 150 and the upper capping layer 146 on the second region R2 of the substrate 100 may also be patterned by the first etching process, and in this case, at least one second trench may be formed to expose a top surface of the conductive pattern 144, etc.

The first upper interconnection line 152 and the second upper interconnection line 154 may be formed in the first trench and the second trench, respectively. The formation of the first and second upper interconnection lines 152 and 154 may include filling the first trench and the second trench with a conductive layer and performing a planarization process to expose a top surface of the fourth interlayer insulating layer 150, but the example embodiments are not limited thereto. As a result of the planarization process, the first and second upper interconnection lines 152 and 154 may have top surfaces that are coplanar and/or substantially coplanar with the top surface of the fourth interlayer insulating layer 150 (e.g., may be coplanar within +/−10% of the top surface of the fourth interlayer insulating layer 150).

According to at least one example embodiment of the inventive concepts, a capping layer may be formed to have a thickness which is smaller on a cell region than on a logic region, and in this case, it may be possible to increase a process margin for reducing the likelihood and/or preventing the capping layer on the cell region from being exposed in a process of forming a magnetic tunnel junction pattern. Accordingly, it may be possible to reduce and/or prevent a short circuit issue, which may occur when the capping layer is exposed, and thereby to reduce a unit cell size of a magnetic memory device and/or increase the manufacturing yield of the magnetic memory devices.

According to at least one example embodiment of the inventive concepts, an insulating layer between the cell region and the logic region may be formed to have an upwardly convex side surface, and in this case, it may be possible to improve stability and/or efficiency in a fabrication process. In addition, an insulating layer may be formed on the logic region, without an additional patterning process, and thus, the fabrication process may be simplified. Furthermore, a protection insulating layer may be thickly formed on a side surface of a magnetic tunnel junction pattern to reduce and/or prevent a magnetic tunnel junction pattern from becoming oxidized, and in this case, a remaining portion of a recess region between the magnetic tunnel junction patterns may be easily formed with an insulating layer. Thus, the fabrication process according to at least one example embodiment of the inventive concepts may be performed in a simplified, more robust, more efficient, and/or more cost effective manner.

While various example embodiments of the inventive concepts have been particularly shown and described, it will be understood by one of ordinary skill in the art that variations in form and detail may be made to the example embodiments without departing from the spirit and scope of the attached claims.

What is claimed is:
1. A magnetic memory device, comprising:
a substrate including a first region and a second region;
a first interlayer insulating layer on the substrate;
a first capping layer on the first interlayer insulating layer, the first capping layer covering the first and second regions of the substrate;
a second interlayer insulating layer on a portion of the first capping layer covering the first region of the substrate;
a bottom electrode contact included in the second interlayer insulating layer;
a magnetic tunnel junction pattern on the bottom electrode contact;

a top electrode on a top surface of the magnetic tunnel junction pattern;

a bottom electrode on a bottom surface of the magnetic tunnel junction pattern;

a second capping layer on the second interlayer insulating layer, the second capping layer being in direct contact with the first capping layer on the second region of the substrate;

third interlayer insulating layer on the second capping layer;

an upper capping layer on the third interlayer insulating layer, the upper capping layer covering the first and second regions of the substrate;

a fourth interlayer insulating layer on the upper capping layer, the fourth interlayer insulating layer covering the first and second regions of the substrate;

an upper interconnection line, the upper interconnection line penetrating the fourth interlayer insulating layer, the upper capping layer, and the second capping layer; and a top surface of the top electrode is exposed through the second capping layer and the third interlayer insulating layer.

2. The magnetic memory device of claim 1, wherein the first capping layer and the second capping layer are a same material or have a same dielectric constant (k).

3. The magnetic memory device of claim 1, wherein the first capping layer on the first region of the substrate has a thickness which is 30% to 70% of a total thickness of the first and second capping layers on the second region of the substrate.

4. The magnetic memory device of claim 1, further comprising:

a protection insulating layer on the second interlayer insulating layer, the protection insulating layer covering a side surface of the magnetic tunnel junction pattern; and a gapfill insulating pattern on the first region of the substrate, the gapfill insulating pattern interposed between the protection insulating layer and the second capping layer.

5. The magnetic memory device of claim 4, wherein the protection insulating layer comprises a material different than a material of the second interlayer insulating layer and a material of the gapfill insulating pattern.

6. The magnetic memory device of claim 1, further comprising:

an upper capping layer on the second capping layer, the upper capping layer covering the first and second regions of the substrate; and a third interlayer insulating layer interposed between the second capping layer and the upper capping layer.

7. A magnetic memory device, comprising:

a substrate including a first region and a second region;

a first interlayer insulating layer on the substrate, the first interlayer insulating layer covering the first and second regions of the substrate;

a first capping layer on the first interlayer insulating layer;

a second interlayer insulating layer on a portion of the first capping layer covering the first region of the substrate;

a bottom electrode contact penetrating the second interlayer insulating layer;

a magnetic tunnel junction pattern on the bottom electrode contact;

a protection insulating layer covering a side surface of the magnetic tunnel junction pattern and the protection insulating layer covering the second interlayer insulating layer;

a second capping layer directly in contact with the first capping layer, the second capping layer having a non-planar top surface in the first region; and a gapfill insulating pattern on the first region of the substrate, the gapfill insulating pattern interposed between the protection insulating layer and the second capping layer, wherein a side surface of the gapfill insulating pattern adjacent to the second region of the substrate has a rounded shape.

8. The magnetic memory device of claim 7, wherein the side surface of the gapfill insulating pattern has a downward slope in a direction toward the second region of the substrate.

9. The magnetic memory device of claim 7, further comprising:

a top electrode on a top surface of the magnetic tunnel junction pattern; and a top surface of the gapfill insulating pattern is lower than a top surface of the top electrode.

10. The magnetic memory device of claim 7, further comprising:

a third interlayer insulating layer on the second capping layer, the third interlayer insulating layer including a material whose dielectric constant is lower than a dielectric constant of the gapfill insulating pattern.

11. The magnetic memory device of claim 10, wherein the second interlayer insulating layer and the gapfill insulating pattern comprise a same material; and the third interlayer insulating layer comprises a material different than the second capping layer.

12. The magnetic memory device of claim 7, further comprising:

a top electrode on a top surface of the magnetic tunnel junction pattern;

a bottom electrode on a bottom surface of the magnetic tunnel junction pattern; and a top surface of the top electrode is exposed through the second capping layer.

13. The magnetic memory device of claim 7, further comprising:

a plurality of magnetic tunnel junction patterns, the plurality of magnetic tunnel junction patterns including the magnetic tunnel junction pattern, wherein the second interlayer insulating layer includes a first recess region, the first recess region being between the plurality of magnetic tunnel junction patterns and is recessed toward the substrate, and the protection insulating layer is extended into a region between an inner surface of the first recess region of the second interlayer insulating layer and the gapfill insulating pattern.

14. A magnetic memory device, comprising:

a substrate including a first region and a second region;

a first interlayer insulating layer on the substrate;

a capping layer on the first interlayer insulating layer;

a second interlayer insulating layer on a portion of the first interlayer insulating layer covering the first region of the substrate;

a plurality of bottom electrode contacts included in the second interlayer insulating layer;

a plurality of data storage structures on the plurality of bottom electrode contacts, each data storage structure of the plurality of data storage structures including a bottom electrode, a magnetic tunnel junction pattern, and a top electrode, and the bottom electrode, the magnetic tunnel junction pattern, and the top electrode being sequentially stacked on a corresponding bottom electrode contact of the plurality of bottom electrode contacts;

a protection insulating layer on the second interlayer insulating layer, the protection insulating layer covering side surfaces of each of the plurality of data storage structures;

an upper capping layer on the protection insulating layer, the upper capping layer covering the first and second regions of the substrate;

a third interlayer insulating layer on the capping layer;

an upper interconnection line on the top electrode, the capping layer includes,
- a first portion covering the first interlayer insulating layer, and
- a second portion directly in contact with a portion of the protection insulating layer on the first region of the substrate, the second portion including a recess region between the data storage structures, the recess region being recessed toward the substrate; and the third interlayer insulating layer fills the recess region of the second portion of the capping layer.

15. The magnetic memory device of claim 14, further comprising:
- a gapfill insulating pattern interposed between the protection insulating layer and the second portion of the capping layer; and
- a material of the capping layer is different from a material of the gapfill insulating pattern and the third interlayer insulating layer.

16. The magnetic memory device of claim 14, wherein
a top surface of the top electrode is exposed through the second portion of the capping layer, the third interlayer insulating layer, and the upper capping layer; and
the upper interconnection line is in contact with the top surface of the top electrode.

17. The magnetic memory device of claim 14, wherein the third interlayer insulating layer has a dielectric constant which is lower than a dielectric constant of the second interlayer insulating layer.

18. The magnetic memory device of claim 14, further comprising:
- a lower interconnection line included in the first interlayer insulating layer; and
- a conductive contact on the second region of the substrate, the conductive contact penetrating the third interlayer insulating layer and the capping layer, and the conductive contact is electrically connected to the lower interconnection line.

* * * * *